United States Patent
Fukuoka

(10) Patent No.: US 8,643,255 B2
(45) Date of Patent: Feb. 4, 2014

(54) PIEZOELECTRIC CERAMIC AND PIEZOELECTRIC ELEMENT USING THE SAME

(75) Inventor: Shyuuichi Fukuoka, Kirishima (JP)

(73) Assignee: Kyocera Corporation, Kyoto (JP)

( * ) Notice: Subject to any disclaimer, the term of this patent is extended or adjusted under 35 U.S.C. 154(b) by 621 days.

(21) Appl. No.: 12/933,404

(22) PCT Filed: Mar. 18, 2009

(86) PCT No.: PCT/JP2009/055353
§ 371 (c)(1),
(2), (4) Date: Dec. 20, 2010

(87) PCT Pub. No.: WO2009/122916
PCT Pub. Date: Oct. 8, 2009

(65) Prior Publication Data
US 2011/0133608 A1    Jun. 9, 2011

(30) Foreign Application Priority Data

Mar. 18, 2008 (JP) .................. 2008-069012
Jul. 25, 2008 (JP) .................. 2008-191768

(51) Int. Cl.
*H01L 41/187* (2006.01)
(52) U.S. Cl.
CPC .................. *H01L 41/1878* (2013.01)
USPC .................. 310/358
(58) Field of Classification Search
USPC .................. 310/358; 252/62.9 PZ
See application file for complete search history.

(56) References Cited

U.S. PATENT DOCUMENTS

| | | | | |
|---|---|---|---|---|
| 5,945,030 A | * | 8/1999 | Kimura et al. | 252/62.9 R |
| 6,117,354 A | * | 9/2000 | Kimura et al. | 252/62.9 R |
| 6,231,779 B1 | * | 5/2001 | Chiang et al. | 252/62.9 R |
| 6,258,291 B1 | * | 7/2001 | Kimura et al. | 252/62.9 R |
| 6,558,567 B2 | * | 5/2003 | Kimura et al. | 252/62.9 PZ |
| 6,764,609 B2 | * | 7/2004 | Takahashi | 252/62.9 R |
| 7,390,426 B2 | * | 6/2008 | Tsukada et al. | 252/62.9 R |
| 7,510,669 B2 | * | 3/2009 | Ogawa et al. | 252/62.9 R |
| 7,525,239 B2 | * | 4/2009 | Aoki et al. | 310/358 |
| 7,580,241 B2 | * | 8/2009 | Sakashita | 361/313 |
| 7,646,140 B2 | * | 1/2010 | Aoki et al. | 310/358 |
| 7,754,095 B2 | * | 7/2010 | Kawada et al. | 252/62.9 R |
| 7,901,590 B2 | * | 3/2011 | Tsukada et al. | 252/62.9 R |
| 7,910,016 B2 | * | 3/2011 | Kawada et al. | 252/62.9 R |
| 8,043,987 B2 | * | 10/2011 | Chen et al. | 501/136 |
| 2004/0166357 A1 | * | 8/2004 | Sakashita | 428/615 |
| 2008/0284284 A1 | * | 11/2008 | Kawada et al. | 310/323.01 |
| 2010/0096952 A1 | | 4/2010 | Fukuoka | |
| 2010/0133959 A1 | * | 6/2010 | Yamazaki et al. | 310/365 |
| 2011/0241483 A1 | * | 10/2011 | Furukawa et al. | 310/323.02 |

FOREIGN PATENT DOCUMENTS

| | | |
|---|---|---|
| JP | 50-034313 B | 11/1975 |
| JP | 2002-167276 A | 6/2002 |
| JP | 2002-193664 A | 7/2002 |
| JP | 2007-119269 A | 5/2007 |

* cited by examiner

*Primary Examiner* — J. San Martin
(74) *Attorney, Agent, or Firm* — Birch, Stewart, Kolasch & Birch, LLP

(57) ABSTRACT

Disclosed is a piezoelectric ceramic indicated by the composition formula $Bi_4Ti_3O_{12} \cdot \alpha[(1-\beta)(M1_{1-\gamma}Ln_\gamma)TiO_3 + \beta M2M3O_3]$, wherein: $\alpha$, $\beta$, and $\gamma$ satisfy $0.3 \leq \alpha \leq 0.95$, $0\beta \leq 0.5$, and $0 \leq \gamma \leq 0.5$; M1 is at least one chosen from Sr, Ba, Ca, $(Bi_{0.5}Na_{0.5})$, $(Bi_{0.55}K_{0.5})$ and $(Bi_{0.5}Li_{0.5})$; M2 is at least one chosen from among Bi, Na, K and Li; M3 is at least one chosen from Fe and Nb; and includes 0.01-0.7 mass % of Co in CoO conversion to 100 mass % of bismuth layered compound where Ln is lanthanoid.

7 Claims, 9 Drawing Sheets

PIEZOELECTRIC CERAMIC AND PIEZOELECTRIC ELEMENT USING THE SAME

This application is the National Stage filing of International Application No. PCT/JP2009/055353 filed on Mar. 18, 2009, which claims priority under 35 U.S.C. §119 to Japanese Application No. 2008-069012 filed on Mar. 18, 2008 and Japanese Application No. 2008-191768 filed on Jul. 25, 2008.

TECHNICAL FIELD

The present invention relates to a piezoelectric ceramic and a piezoelectric element using the same, and more specifically, to a piezoelectric ceramic suitable for resonators, ultrasonic oscillators, ultrasonic motors, acceleration sensors, knocking sensors, AE sensors, and the like, and in particular, a piezoelectric ceramic preferably applicable to piezoelectric sensors utilizing a positive piezoelectric effect of thickness longitudinal vibration, and a piezoelectric element using the same.

BACKGROUND ART

Products utilizing a piezoelectric ceramic include, for example, piezoelectric sensors, filters, piezoelectric resonators, ultrasonic oscillators, ultrasonic motors, and the like.

Piezoelectric sensors are used as shock sensors, acceleration sensor, or on-vehicle knocking sensors. In particular, in recent years, research has been conducted on use of a piezoelectric sensor as a pressure sensor for directly detecting a pressure in a cylinder to optimize a timing of fuel injection from an injector in order to improve fuel efficiency and reduce exhaust gas (HC, NOx).

A mechanism for detecting a change in pressure in a cylinder is now described. The pressure comprises, for example: a pressure transmission pin protruding in a cylinder of an engine; and a piezoelectric sensor which detects a change in pressure transmitted through the pressure transmission pin in the cylinder. A portion of a head of the pressure transmission pin protrudes inside the cylinder so as to transmit pressure in the cylinder, and the portion is subjected to high temperatures during combustion in the cylinder. Consequently, in addition to a large change in pressure, heat is also transmitted to the piezoelectric sensor connected to the pressure transmission pin, and its temperature reaches 150° C.

Existing piezoelectric ceramics comprise, a PZT (lead zirconate titanate)-based material or a PT (lead titanate)-based material, which has a high piezoelectric property and a large piezoelectric constant d.

However, it has been pointed out that, since the PZT- or PT-based material contains about 60% by mass of lead, there is a possibility that leaching of lead may be caused by acid rain, resulting in environmental contamination.

In addition, since the PZT-based material or the PT-based material has a Curie temperature $T_c$ of about 200° C. to 300° C., the piezoelectric constant d decreases when used under a high temperature of about 150° C., and the piezoelectric constant d at 150° C. largely varies with respect to the piezoelectric constant d at room temperature. Therefore, use thereof has been restricted greatly. For example, in the case where a piezoelectric material that is a PZT-based material or PT-based material is used as a pressure sensor which directly detects the pressure in an engine cylinder, when the piezoelectric material is subjected to a high temperature of 150° C., it changes with time, resulting in a decrease in the piezoelectric constant d. Therefore, the output voltage varies even under the same applied pressure, and since the piezoelectric constant d at 150° C. largely varies with respect to the piezoelectric constant d at room temperature, linearity cannot be obtained in the relationship between pressure and output voltage, and it is difficult to calculate an accurate pressure from the output voltage.

On the other hand, in order to obtain pressure sensor characteristics which are stable even under a high temperature of 150° C., use of a single crystal of langasite, quartz, or the like has also been studied. However, in the case of a single crystal, the piezoelectric constant d is small, which is a problem. Moreover, the single crystal is easily chipped and cracked during processing, and is easily cracked when pressure is applied during actual use. Furthermore, the production cost of the single crystal is very high, which is a problem.

Under these circumstances, there is a high expectation for piezoelectric materials not containing lead. As a piezoelectric material not containing lead, for example, Patent Document 1 proposes a material containing, as a main component, a bismuth layered compound. Many piezoelectric ceramics containing, as a main component, a bismuth layered compound have a Curie temperature of about 400° C. or higher. Such piezoelectric materials have high heat resistance, and there is a possibility that they can be applied to piezoelectric elements used in an environment subjected to high temperatures, for example, in an engine room.

However, in the piezoelectric ceramic mainly composed of a bismuth layered compound described in Patent Document 1, the hysteresis of the output charge caused by a positive piezoelectric effect when a load is applied is large. That is, the difference between the output charge caused in a state in which the applied load increases and the output charge caused in a state in which the applied load decreases is large, which is a problem. Accordingly, when such a piezoelectric ceramic is used, for example, as a piezoelectric element for a pressure sensor, the difference in hysteresis causes an error in the load measured, and its pressure detection accuracy is degraded.

Patent Document 1: Japanese Unexamined Patent Application Publication No. 2002-167276

DISCLOSURE OF THE INVENTION

Problems to be Solved by the Invention

It is an object of the present invention to provide a piezoelectric ceramic which has good heat resistance and a small hysteresis in the potential difference caused by a positive piezoelectric effect, and a piezoelectric element.

Means for Solving the Problems

A piezoelectric ceramic according to the present invention comprises a bismuth layered compound represented by the composition formula: $Bi_4Ti_3O_{12} \cdot \alpha[(1-\beta)(M1_{1-\gamma}Ln_\gamma)TiO_3 + \beta M2M3O_3]$, (wherein $\alpha$, $\beta$, and $\gamma$ satisfy $0.3 \leq \alpha \leq 0.95$, $0 \leq \beta \leq 0.5$, and $0 \leq \gamma \leq 0.5$; M1 is at least one selected from Sr, Ba, Ca, $(Bi_{0.5}Na_{0.5})$, $(Bi_{0.5}K_{0.5})$, and $(Bi_{0.5}Li_{0.5})$; M2 is at least one selected from Bi, Na, K, and Li; M3 is at least one selected from Fe and Nb; and Ln represents a lanthanoid), and Co in an amount of 0.01 to 0.7 parts by mass in terms of CoO, with respect to 100 parts by mass of the bismuth layered compound.

According to the present invention, particularly and preferably, $0.05 \leq \beta \leq 0.5$.

Preferably, M1 is $Sr_\delta Ba_{(1-\delta)}$, $0.2 \leq \delta \leq 0.8$, and $\gamma=0$.

Preferably, Co is contained in an amount of 0.1 parts by mass or more, in terms of CoO, with respect to 100 parts by mass of the bismuth layered compound in which $0.01 \leq \gamma$ in the composition formula.

Preferably, Co is contained in an amount of 0.2 parts by mass or more in terms of CoO, with respect to 100 parts by mass of the bismuth layered compound in which, in the composition formula, $0.4 \leq \alpha \leq 0.7$, $\beta=0$, the total content of Sr and Ba in M1 is 90 atomic percent or more, and Ln is La.

Preferably, Co is contained in an amount of 0.1 to 0.5 parts by mass, in terms of CoO, with respect to 100 parts by mass of the bismuth layered compound in which, in the composition formula, $0.4 \leq \alpha \leq 0.7$, M2M3O$_3$ is BiFeO$_3$, $0.1 \leq \beta \leq 0.3$, the total content of Sr and Ba in M1 is 90 atomic percent or more, and Ln is La.

A piezoelectric element according to the present invention includes a base member composed of the above piezoelectric ceramic and electrodes located on both surfaces of the base member.

Effects of the Invention

According to the piezoelectric ceramic of the present invention, since Co is contained in an amount of 0.01 to 0.7 parts by mass, in terms of CoO, with respect to 100 parts by mass of the bismuth layered compound represented by the composition formula described above, the hysteresis of dynamic piezoelectric constant $d_{33}$ can be decreased.

In particular, if $0.05 \leq \beta \leq 0.5$, it is possible to obtain a piezoelectric ceramic having stable piezoelectric characteristics in which the variation in dynamic piezoelectric constant $d_{33}$ is small even if the firing temperature varies.

If M1 is Sr$_\delta$Ba$_{(1-\delta)}$, $0.2 \leq \delta \leq 0.8$, and $\gamma=0$, the dynamic piezoelectric constant $d_{33}$ can be increased, and the change in dynamic piezoelectric constant $d_{33}$ due to temperature change can be decreased.

If Co is contained in an amount of 0.1 parts by mass or more, in terms of CoO, with respect to 100 parts by mass of the bismuth layered compound in which, in the composition formula, $0.01 \leq \gamma$, the flexural strength of the piezoelectric ceramic increases, and the piezoelectric ceramic is not easily broken by stress.

If Co is contained in an amount of 0.2 parts by mass or more, in terms of CoO, with respect to 100 parts by mass of the bismuth layered compound in which, in the composition formula, $0.4 \leq \alpha \leq 0.7$, $\beta=0$, the total content of Sr and Ba in M1 is 90 atomic percent or more, and Ln is La, the dynamic piezoelectric constant $d_{33}$ can be further increased.

If Co is contained in an amount of 0.1 to 0.5 parts by mass, in terms of CoO, with respect to 100 parts by mass of the bismuth layered compound in which, in the composition formula, $0.4 \leq \alpha \leq 0.7$, M2M3O$_3$ is BiFeO$_3$, $0.1 \leq \beta \leq 0.3$, the total content of Sr and Ba in M1 is 90 atomic percent or more, and Ln is La, the dynamic piezoelectric constant $d_{33}$ can be further increased.

Furthermore, according to the piezoelectric element of the present invention, the piezoelectric element has a structure in which electrodes are provided on both surfaces of a base member composed of the piezoelectric ceramic. Since the piezoelectric element is a polycrystal, it is possible to obtain a piezoelectric element which, unlike a single crystal, does not have a property of being easily cracked along a specific plane, in which flaws, such as chipping, do not easily occur, and the amount of defects due thereto decreases, and which has a good yield.

BEST MODE FOR CARRYING OUT THE INVENTION

A piezoelectric ceramic of the present invention contains a bismuth layered compound, as a main component, represented by the composition formula Bi$_4$Ti$_3$O$_{12}$·$\alpha$[(1−$\beta$)(M1$_{1-\gamma}$Ln$_\gamma$)TiO$_3$+$\beta$M2M3O$_3$], wherein $\alpha$, $\beta$, and $\gamma$ satisfy the relationships $0.3 \leq \alpha \leq 0.95$, $0 \leq \beta \leq 0.5$, and $0 \leq \gamma \leq 0.5$; M1 is at least one selected from Sr, Ba, Ca, (Bi$_{0.5}$Na$_{0.5}$), (Bi$_{0.5}$K$_{0.5}$), and (Bi$_{0.5}$Li$_{0.5}$); M2 is at least one selected from Bi, Na, K, and Li; M3 is at least one selected from Fe and Nb; and Ln represents a lanthanoid, and Co in an amount of 0.01 to 0.7 parts by mass in terms of CoO, with respect to 100 parts by mass of the main component.

First, the output charge caused by a positive piezoelectric effect and a hysteresis thereof is now described. The output charge caused by a positive piezoelectric effect can be measured, for example, using an apparatus shown in FIG. 1. In the apparatus, a load $F_{low}$ is applied to a piezoelectric element 5 including electrodes 2 and 3 located on upper and lower surfaces of a plate-like piezoelectric ceramic 1. Thereafter, the load applied to the piezoelectric element 5 is increased to $F_{high}$ and then decreased to $F_{low}$, and this procedure is repeated, during which the output charge Q generated in the piezoelectric element 5 is measured by a charge amplifier. During this procedure, the load is applied, for example, by a triangular wave of 10 Hz in which $F_{low}$=250 N and $F_{high}$=300 N.

Figure 2:
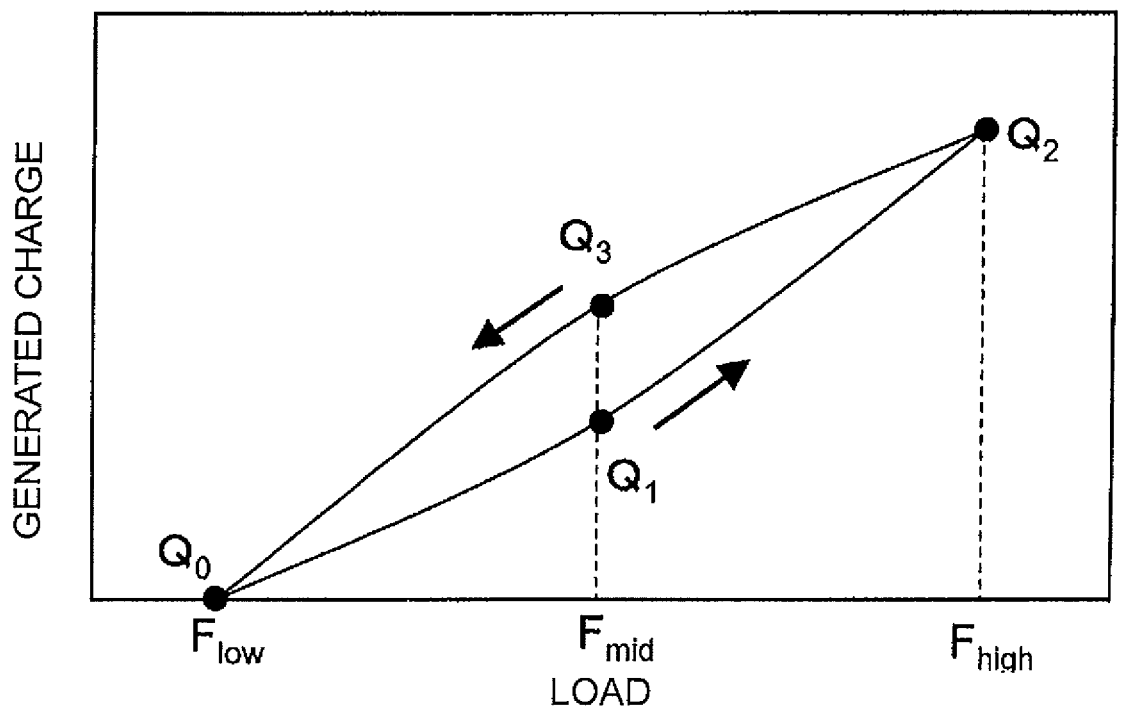
FIG. 2 is a diagram showing a hysteresis of generated charge.

The relationship between the load and the output charge measured in such a manner is, for example, shown in FIG. 2. In the graph, the arrows indicate whether measurement is made when the load is increased or measurement is made when the load is decreased, In FIG. 2, the output charge measured when the applied load is increased is lower. $Q_0$ represents the output charge at the load $F_{low}$, $Q_1$ represents the output charge at the load $F_{mid}$ (=($F_{low}$+$F_{high}$)/2) when the load is increased, $Q_2$ represents the output charge at the load $F_{high}$, and $Q_3$ represents the output charge at the load $F_{mid}$ when the load is decreased. Q1 and Q3 do not coincide with each other, and a difference therebetween corresponds to a hysteresis. Hereinafter, the value $(Q_3-Q_1)/(Q_2-Q_0)$ is considered as an index of hysteresis, and simply referred to as "hysteresis".

The value of hysteresis is preferably 1% or less, and particularly preferably 0.5% or less. Note that the hysteresis is basically 0 or more.

Next, the dynamic piezoelectric constant $d_{33}$ is described. The dynamic piezoelectric constant $d_{33}$ is determined according to the formula described below, using the observed value of output voltage when a load is directly applied to the piezoelectric element 5. Conventionally, the piezoelectric constant $d_{33}$ has been measured using a resonance impedance method. However, in that method, since the load applied to the piezoelectric element 5 is small, the dynamic characteristic at the time of applying an actual load cannot be evaluated. Therefore, the piezoelectric constant $d_{33}$ (=output charge/change in load) is measured from the relationship between load and output charge at the time of applying an actual load, and this is considered as the dynamic piezoelectric constant $d_{33}$.

The specific measurement apparatus and measurement method are the same as those in the case of the hysteresis measurement described above. For example, first, an offset load of 250 N is applied to the piezoelectric element 5, and a load of 50 N in the form of a triangle wave is applied in addition to the offset load. The output charge Q at the peak load of 50 N of the triangle wave applied to the piezoelectric element 5 is measured by a charge amplifier. From the relationship between the applied load of 50 N and the output charge Q, the dynamic piezoelectric constant $d_{33}$ is determined to be $d_{33}$=Q/50N (change in load). That is, the dynamic piezoelectric constant $d_{33}$ has a unit of measure of C (coulomb)/N, and means a piezoelectric constant $d_{33}$ in a dynamic state at the time of applying a load to the piezoelectric element.

The reason for applying an offset load of 250 N is that by preventing a tensile force from being applied to the piezoelectric element 5, stable output characteristics are obtained. Furthermore, a change in load is set at 50 N in order to exemplify, for example, a range required for detecting a change in pressure in a cylinder of an engine as an application example.

The reason for setting the range $0.3 \leq \alpha \leq 0.95$ in the composition formula is that, if $\alpha$ is less than 0.3, the hysteresis increases. Furthermore, if $\alpha$ is less than 0.3, leakage current increases, and the dynamic piezoelectric constant $d_{33}$ decreases. On the other hand, if $\alpha$ exceeds 0.95, the hysteresis increases, and the dynamic piezoelectric constant $d_{33}$ decreases.

M1 is at least one selected from Sr, Ba, Ca, $(Bi_{0.5}Na_{0.5})$, $(Bi_{0.6}K_{0.5})$, and $(Bi_{0.6}Li_{0.5})$. If the molar percentage of Si in M1 is high, the dynamic piezoelectric constant $d_{33}$ can be increased, which is preferable. If the molar percentage of Ba in M1 is high, the hysteresis can be decreased, which is preferable. The molar percentage of Ba in M1 is preferably 20% or more, and particularly preferably 40% or more. If the molar percentage of Ca in M1 is high, linearity of the change in dynamic piezoelectric constant $d_{33}$ with respect to temperature improves, which is preferable. Furthermore, if the total molar percentage of Ba and Ca in M1 is high, the temperature dependence of the dynamic piezoelectric constant $d_{33}$ decreases, which is preferable.

Furthermore, in the case where M1 contains at least one of $(Bi_{0.5}Na_{0.5})$, $(Bi_{0.5}K_{0.55})$, and $(Bi_{0.5}Li_{0.5})$, sinterability of the piezoelectric ceramic improves. The sinterability improves as the total molar percentage of $(Bi_{0.5}Na_{0.5})$, $(Bi_{0.5}K_{0.5})$, and $(Bi_{0.5}Li_{0.5})$ in M1 increases. Since $(Bi_{0.5}Na_{0.5})$, $(Bi_{0.5}K_{0.5})$, and $(Bi_{0.5}Li_{0.5})$ are each divalent in average, they can be mixed for use at any ratio with Sr, Ba, and Ca.

In order to increase the dynamic piezoelectric constant $d_{33}$ and decrease the temperature dependence of the dynamic piezoelectric constant $d_{33}$, preferably, M1 is $Sr_\delta Ba_{(1-\delta)}$, and $0.2 \leq \delta \leq 0.8$. In order to further decrease the hysteresis, more preferably $0.4 \leq \delta \leq 0.8$, and particularly preferably $0.4 \leq \delta \leq 0.6$.

The reason for setting the substitution amount $\beta$ of M2M3O$_3$, in which M2 is at least one selected from Bi, Na, K, and Li, and M3 is at least one selected from Fe and Nb, so as to satisfy $0 \leq \beta \leq 0.5$ is that, if $\beta$ exceeds 0.5, the dynamic piezoelectric constant $d_{33}$ decreases. M2M3O$_3$ has the effect of expanding the range of firing temperature at which stable characteristics can be obtained (stable firing temperature range). If $0 \leq \beta \leq 0.05$, the stable firing temperature range can be set within a range of about 10° C. or less. Furthermore, if $0.05 \leq \beta \leq 0.5$, sinterability improves, and the stable firing temperature range can be expanded to about 15° C. to 30° C. without substantially decreasing the dynamic piezoelectric constant $d_{33}$. The range $0.1 \leq \beta \leq 0.3$ is more preferable because the stable firing temperature range can be expanded, and a decrease in the dynamic piezoelectric constant $d_{33}$ can be reduced significantly. In addition, in view of expanding the stable firing temperature range, particularly preferably, M2M3O$_3$ is BiFeO$_3$.

Next, the amount of Co contained with respect to 100 parts by mass of the $Bi_4Ti_3O_{12} \cdot \alpha[(1-\beta)(M1_{1-\gamma}Ln_\gamma)TiO_3 + \beta M2M3O_3]$ component is described. If the content of Co, in terms of CoO, is less than 0.01 parts by mass, the dynamic piezoelectric constant $d_{33}$ decreases, and the hysteresis increases. On the other hand, if the content of Co, in terms of CoO, exceeds 0.7 parts by mass, the hysteresis also increases. The content of CoO is preferably 0.1 to 0.3 parts by mass, at which the hysteresis can be further decreased, and particularly preferably 0.2 to 0.3 parts by mass.

The reason for the decrease in hysteresis is believed to be that, if the piezoelectric ceramic is subjected to a change in pressure, a change in the ferroelectric domain structure does not easily occur, and since the charge caused by the positive piezoelectric effect is supplied to the detection apparatus without being consumed in the ceramic, a drift in output charge is significantly decreased.

Since the bismuth layered compound is composed of tabular crystals and difficult to sinter, MnO$_2$ may be added thereto as a sintering aid. In such a case, preferably, Mn is added in an amount of 0.1 parts by mass or less, in terms of MnO$_2$, with respect to 100 parts by mass of the $Bi_4Ti_3O_{12} \cdot \alpha[(1-\beta)(M1_{1-\gamma}Ln_\gamma)TiO_3 + \beta M2M3O_3]$ component. If the amount of Mn, in terms of MnO$_2$, exceeds 0.1 parts by mass, there is a possibility that the hysteresis may be increased.

Ln is specifically at least one selected from La, Ce, Pr, Nd, Pm, Sm, Eu, Gd, Tb, Dy, Ho, Er, Tm, Yb, and Lu. By incorporating Ln and Co in the ranges described above, the flexural strength of the piezoelectric ceramic can be set at 200 MPa or more. The reason for setting the substitution amount $\gamma$ of Ln so as to satisfy $0.01 \leq \gamma \leq 0.5$ is that, if $\gamma$ is less than 0.01, the flexural strength decreases. Furthermore, if $\gamma$ exceeds 0.5, the dynamic piezoelectric constant $d_{33}$, which will be described below, decreases. If $\gamma$ is 0.4 or more, the optimum firing temperature range expands, which is preferable. Furthermore, among lanthanoids, La and Nd are preferable from the standpoint that the optimum firing temperature range expands, and in particular, La is preferable from the standpoint that the dynamic piezoelectric constant $d_{33}$ increases.

Taking all the factors described above into consideration, when Co is incorporated in an amount of 0.2 to 1 part by mass, in terms of CoO, with respect to 100 parts by mass of the bismuth layered compound (main component) in which $0.4 \leq \alpha \leq 0.7$, $\beta=0$, the total content of Sr and Ba in M1 is 90 atomic percent or more, and Ln is La, the dynamic piezoelectric constant $d_{33}$ of the piezoelectric ceramic can be set at 20 pC/N. Furthermore, by incorporating Co in an amount of 0.1 to 0.5 parts by mass, in terms of CoO, with respect to 100 parts by mass of the bismuth layered compound (main component) in which $0.4 \leq \alpha \leq 0.7$, M2M3O$_3$ is BiFeO$_3$, $0.1 \leq \beta \leq 0.3$, the total content of Sr and Ba in M1 is 90 atomic percent or more, and Ln is La, the dynamic piezoelectric constant $d_{33}$ of the piezoelectric ceramic can be set at 20 pC/N.

The piezoelectric ceramic according to the present invention, the composition formula of which is represented by Bi$_4$Ti$_3$O$_{12}$·α[(1−β)(M1$_{1-\gamma}$Ln$_\gamma$)TiO$_3$+βM2M3O$_3$], has a main crystal phase composed of a bismuth layered compound. Basically, this is believed to a bismuth layered compound represented by Bi$_4$Ti$_3$O$_{12}$·αM1TiO$_3$, in which part of M1 constituting the pseudo-perovskite layer of the bismuth layered compound is replaced by M2, and part of Ti is replaced by M3. That is, in the piezoelectric ceramic of the present invention, in a bismuth layered structure represented by the general formula $(Bi_2O_2)^{2+}(\alpha_{m-1}\alpha_mO_{3m+1})^{2-}$, by adjusting the types and amounts of constituent elements coordinated to the α site, the α site, and the oxygen site, it is possible to obtain a bismuth layered structure having a morphotropic phase boundary (MPB) in which there are both a tetragonal crystal produced if m=4 and an orthorhombic crystal produced if m=3. As a result, it is possible to realize characteristic piezoelectric properties in the vicinity of the MPB composition, which is also known in PZT, in the bismuth layered compound.

Furthermore, there may be cases where Co is dissolved as a solid solution in the main crystal phase and partially precipitated as crystals of Co compounds in the grain boundaries, or there may be cases where there are, as other crystal phases, a pyrochlore phase, a perovskite phase, and bismuth layered compounds having different structures. However, as long as the amount thereof is very small, no problem arises in terms of properties.

In some cases, Zr or the like may be mixed into the piezoelectric ceramic of the present invention from ZrO$_2$ balls during pulverization. However, as long as the amount thereof is very small, no problem arises in terms of properties.

In the piezoelectric ceramic of the present invention, as raw materials, for example, various oxides including SrCO$_3$, BaCO$_3$, CaCO$_3$, Nb$_2$O$_5$, Bi$_2$O$_3$, TiO$_2$, Na$_2$CO$_3$, K$_2$CO$_3$, Li$_2$CO$_3$, Fe$_2$O$_3$, Ln$_2$O$_3$, and CoO, or salts thereof can be used. Ln is at least one selected from La, Ce, Pr, Nd, Pm, Sm, Eu, Gd, Tb, Dy, Ho, Er, Tm, Yb, and Lu. The raw materials are not limited thereto, and metal salts, such as carbonates and nitrates, which produce oxides upon firing may be used.

These raw materials are weighed such that, when a bismuth layered compound, as a main component, is represented by the formula Bi$_4$Ti$_3$O$_{12}$·α[(1−β)(M1$_{1-\gamma}$Ln$_\gamma$)TiO$_3$+βM2M3O$_3$], $0.3 \leq \alpha \leq 0.95$, $0 \leq \Theta \leq 0.5$, and $0 \leq \gamma \leq 0.5$ are satisfied; M1 is at least one selected from Sr, Ba, Ca, (Bi$_{0.5}$Na$_{0.5}$), (Bi$_{0.5}$K$_{0.5}$), and (Bi$_{0.5}$Li$_{0.5}$); M2 is at least one selected from Bi, Na, K, and Li; M3 is at least one selected from Fe and Nb; and Ln represents a lanthanoid, and such that Co is contained in an amount of 0.01 to 0.7 parts by mass, in terms of CoO, with respect to 100 parts by mass of the bismuth layered compound. The powders weighed and mixed are pulverized such that the mean particle size distribution (D$_{50}$) is in the range of 0.5 to 1 μm, and the mixture is calcined at 800° C. to 1,050° C. A predetermined organic binder is added thereto, and the resulting mixture is wet-mixed and granulated. The powder thus obtained is formed into a predetermined shape by known press forming or the like, and firing is performed in an oxidizing atmosphere, such as in the air, in a temperature range of 1,050° C. to 1,250° C. for 2 to 5 hours. Thereby, a piezoelectric ceramic of the present invention is obtained.

The piezoelectric ceramic of the present invention is most suitable as a piezoelectric ceramic for pressure sensors, and in addition, can be used for piezoelectric resonators, ultrasonic oscillators, ultrasonic motors, and piezoelectric sensors, such as acceleration sensors, knocking sensors, and AE sensors.

Figure 3:
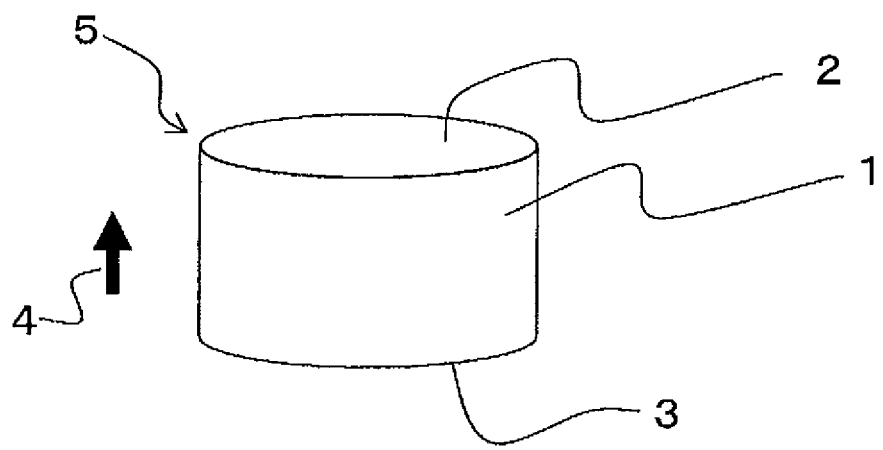
FIG. 3 is a perspective view of a pressure sensor which is an embodiment of a piezoelectric element of the present invention.

FIG. 3 shows a piezoelectric element 5 according to an embodiment of the present invention. The piezoelectric element 5 includes a cylindrical base member 1 composed of the piezoelectric ceramic described above and electrodes 2 and 3 provided on both surfaces of the base member 1. Referring to FIG. 3, the electrodes 2 and 3 are formed over the entire circular surfaces, which are upper and lower surfaces, of the base member 1. Furthermore, polarization has been performed in the thickness direction, indicated by an arrow 4, of the base member 1. When such a piezoelectric element 5 is used for directly detecting a pressure in an automotive engine cylinder, for example, even if a high load of 500 N is applied at a high temperature of 150° C., the piezoelectric element operates stably without being broken. According to simulation stress analysis, even when a load of 500 N is applied, the maximum principal stress generated in the piezoelectric element 5 is about one-tenth or less of the mechanical strength of the piezoelectric ceramic constituting the base member 1.

Figure 7:
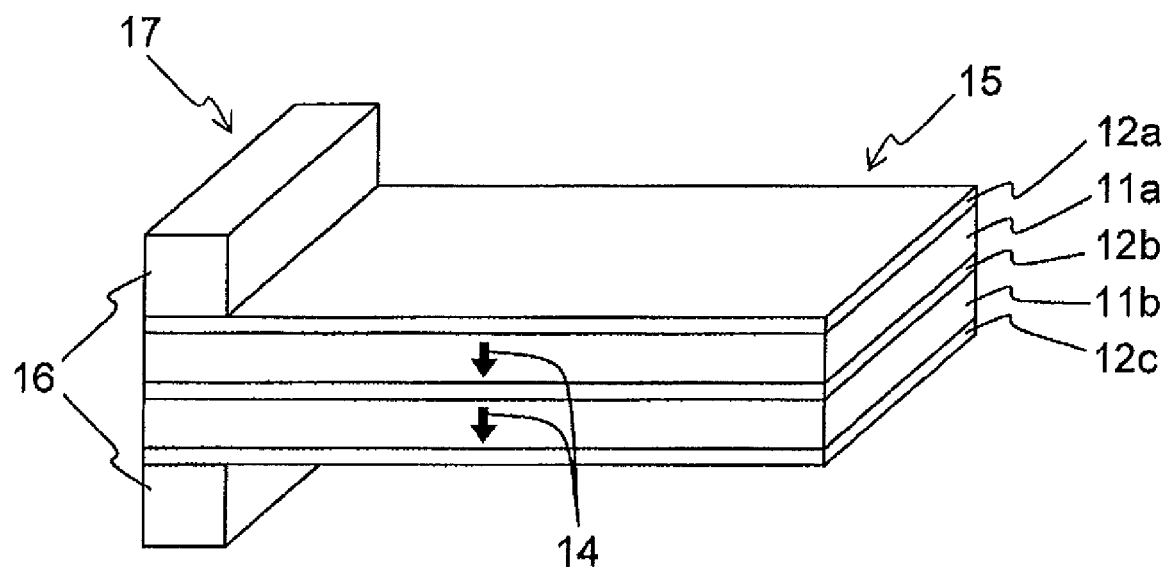
FIG. 7 is a perspective view of a shock sensor which is an embodiment of a piezoelectric element of the present invention.

FIG. 7 shows a shock sensor 17 using a piezoelectric element 15 according to an embodiment of the present invention. The piezoelectric element 15 has a bimorph structure in which plate-like base members 11a and 11b, each composed of the piezoelectric ceramic described above, are stacked, electrodes 12a and 12b are formed on both surfaces of the base member 11a, and electrodes 12b and 12c are formed on both surfaces of the base member 11b, Furthermore, polarization has been performed in the thickness direction, indicated by arrows 14, of the base members 11a and 11b. One end of the piezoelectric element 15 is fixed with a stationary portion 16, thus constituting the shock sensor 17 as a whole. When shock (acceleration) is applied from the outside to the shock sensor 17, the other end of the piezoelectric element 15 is displaced with respect to the stationary portion 16, and the charge generated in the piezoelectric element 15, which is deflected in the stacking direction, is measured by a potential difference between the electrode 12b and each of the electrodes 12a and 12c. Thereby, it is possible to measure the acceleration applied to the shock sensor 17.

Such a shock sensor 17 can be fabricated using a PZT-based piezoelectric ceramic. However, in the PZT-based piezoelectric ceramic, since the flexural strength is about 80 MPa at a maximum, a metal plate is used for the electrode 12b or the like so that cracking does not occur when large acceleration is applied, such as in the case of being dropped. However, when the electrode 12b is composed of a metal plate, sensitivity of the piezoelectric element may be degraded, or the size of the element may be increased, which is a problem.

In contrast, in a piezoelectric ceramic having a flexural strength of 200 MPa or more, as in the piezoelectric ceramic according to the present invention, a sintered conductor, such as Ag/Pd, can be used for the electrodes 12a, 12b, and 12c, and it is possible to fabricate a small, high-sensitivity shock sensor 17 which is difficult to break. For example, using base members 11a and 11b in each of which the size of a sensing portion, i.e., a deflection portion extending from the stationary portion 16, is set to be 1.0 mm in length×0.21 mm in width×30 μm in thickness, it is possible to fabricate a shock sensor 17 having a bimorph structure including two layers. Such a shock sensor 17 can be, for example, mounted on a hard disk drive and used as a sensor for protecting against dropping shock.

Drop shock reliability test for such a shock sensor 17 is performed, for example, by a method in which the shock sensor 17 is mounted on a 2.5-inch hard disk circuit board, and dropped naturally from a height of 1.5 m onto a concrete plane. In the case of piezoelectric ceramics having a flexural strength of less than 200 MPa, when sensor characteristics were tested after the drop test was carried out 10 times, breakage or cracking occurred in some of piezoelectric ceramics, and defects, such as spurious defects, occurred in characteristics of many piezoelectric ceramics. In contrast, in the case of piezoelectric ceramics having a flexural strength of 200 MPa or more, occurrences of cracking or changes in characteristics are not substantially observed, and the failure probability according to the Weibull evaluation can be reduced to 1 ppm or less.

The present invention is described in detail with using examples below, However, it is to be understood that the present invention is not limited to the examples below.

EXAMPLES

First, as starting materials, $SrCO_3$ powder, $BaCO_3$ powder, $CaCO_3$ powder, $Bi_2O_3$ powder, $TiO_2$ powder, $Na_2CO_3$ powder, $K_2CO_3$ powder, $Li_2CO_3$ powder, $Fe_2O_3$ powder, $Nb_2O_5$ powder, and $Ln_2O_3$ powder, each having a purity of 99.9%, were weighed such that, when a composition formula by the molar ratio was represented by $Bi_4Ti_3O_{12} \cdot \alpha[(1-\beta)(M1_{1-\gamma}Ln_\gamma)TiO_3 \cdot \beta M2M3O_3]$, M1, M2, M3, Ln, $\alpha$, $\beta$, and $\gamma$ were elements or mixing ratios shown in Tables 1 to 4.

CoO powder and/or $MnO_2$ powder was weighed in the amounts (parts by weight) shown in Tables 1 to 4 with respect to 100 parts by weight of the main component, and mixing was performed. The resulting mixture was charged into a 500 ml resin pot together with zirconia balls having a purity of 99.9% and water or isopropyl alcohol (IPA), and mixing was performed for 16 hours with the resin pot being placed on a rotating table.

After mixing, the resulting slurry was dried in the air and passed through a No. 40 mesh. Then, the resulting product was calcined by being retained in the air at 950° C. for 3 hours. The synthetic powder thus obtained was charged into a 500 ml resin pot together with $ZrO_2$ balls having a purity of 99.9% and water or isopropyl alcohol (IPA), and pulverization was performed for 20 hours with the resin pot being placed on a rotating table.

An appropriate amount of an organic binder was added to the powder thus obtained, and granulation was performed. The resulting granules were formed into a cylindrical shaped body by die pressing at a load of 150 MPa, followed by binder removal. Then, firing was performed in the air atmosphere, at a peak temperature at which the dynamic piezoelectric constant $d_{33}$ of each sample had the largest value between 1,050° C. and 1,250° C., for 3 hours. Thereby, a disk-like piezoelectric ceramic having a diameter of 4 mm and a thickness of 2 mm was obtained. Furthermore, piezoelectric ceramics were produced by firing while varying the firing peak temperature in steps of 5° C. within the range of −20° C. to +20° C. with respect to the firing peak temperature at which the dynamic piezoelectric constant $d_{33}$ had the largest value.

Then, Ag electrodes were attached by baking to both main surfaces of the cylindrical piezoelectric ceramic, and polarization treatment was performed under a condition of 200° C. by applying a DC voltage of 5 kV/mm or more in the thickness direction, followed by thermal aging at 300° C. for 24 hours.

Figure 1:
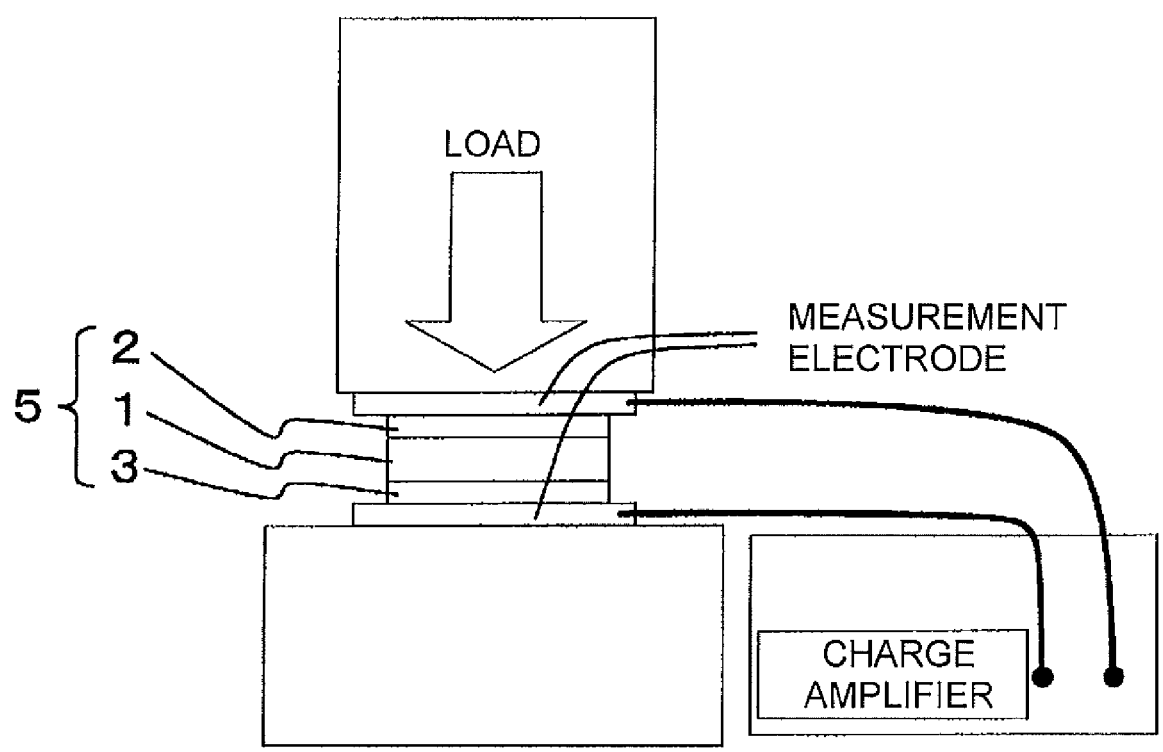
FIG. 1 is a schematic illustration showing an apparatus for evaluating the dynamic piezoelectric constant $d_{33}$ of a piezoelectric ceramic.

Next, using the apparatus shown in FIG. 1, the dynamic piezoelectric constant $d_{33}$ at room temperature (25° C.) and the hysteresis were evaluated. Specifically, first, an offset load of 250 N was applied to the piezoelectric element 5. Thereafter, the load applied to the piezoelectric element 5 was increased to 300 N and then decreased back to 250 N, and this procedure was repeated, during which a change in the amount of charge output from the piezoelectric element 5 was measured by a charge amplifier. During this procedure, the load was applied by a triangular wave of 10 Hz. The dynamic piezoelectric constant $d_{33}$ was calculated according to the formula: dynamic piezoelectric constant $d_{33}$=output charge/change in load (units: pC/N). Similarly, by measuring the dynamic piezoelectric constant $d_{33}$ at −40° C. and 150° C., the rate of change in dynamic piezoelectric constant $d_{33}$ due to temperature change was calculated. The rate of change in dynamic piezoelectric constant $d_{33}$ due to temperature change from room temperature to T° C. was calculated from the dynamic piezoelectric constant $d_{33}$ at room temperature (25° C.) and the dynamic piezoelectric constant $d_{33}$ at T° C., according to the formula: (dynamic piezoelectric constant $d_{33}$ at T° C.—dynamic piezoelectric constant $d_{33}$ at room temperature (25° C.))/(dynamic piezoelectric constant $d_{33}$ at room temperature (25° C.)).

Furthermore, test pieces for measuring flexural strength were produced in the same manner as described above, and the flexural strength was evaluated by the four-point bending method according to JIS 81606. In each of the samples shown in Tables 1 and 2, the flexural strength was 182 MPa or less.

Furthermore, the volume resistivity was evaluated according to JIS-C2141. A volume resistivity of $1 \times 10^9$ Ω·m or more is evaluated to be good, which is expressed by "○" in Tables 1 to 4, and a volume resistivity of less than $1 \times 10^9$ Ω·m is evaluated to be poor, which is expressed by "×" in Tables 1 to 4. The reason for this is that, in order to maintain detection sensitivity at a high temperature of 150° C., the piezoelectric element 5 is desired to have a volume resistivity of $1 \times 10^9$ Ω·m or more. When the volume resistivity is higher than this value, the output charge is suppressed from being consumed by the piezoelectric element 5, and is supplied to a signal processing circuit. Therefore, the variation in sensitivity is small, and the output charge does not decrease sensitivity or does not cause noise, thus preventing degradation in sensor characteristics.

The results of the sample having the largest dynamic piezoelectric constant $d_{33}$ which are picked up among those produced at the different firing peak temperatures, for each composition are shown in Tables 1 to 4. Furthermore, in each composition, the dynamic piezoelectric constant $d_{33}$ of samples for which the firing peak temperature was changed was compared with the sample having the largest dynamic piezoelectric constant $d_{33}$, and a firing temperature range in which the decrease in the dynamic piezoelectric constant $d_{33}$ was 3% or less was checked, and this range was considered as the stable firing temperature range for each composition. If the temperature range is large, the variation in the dynamic piezoelectric constant $d_{33}$ is small when the firing temperature varies during manufacturing, and it is possible to produce a piezoelectric ceramic having stable piezoelectric characteristics.

TABLE 1

| Sample No. | Composition M1 | α | M2 | M3 | β | Ln | γ | Additive Composition | Additive parts by mass | Stable firing temperature range °C | Dynamic piezoelectric constant $d_{33}$ pC/N | Hysteresis % | Rate of change in dynamic piezoelectric constant $d_{33}$ due to temperature change 25→−40° C. % | 25→150° C. % | Volume resistivity |
|---|---|---|---|---|---|---|---|---|---|---|---|---|---|---|---|
| *1 | $Sr_{0.5}Ba_{0.5}$ | 0 | — | — | — | — | — | CoO | 0.2 | 10 | 5.3 | 1.8 | 1.1 | 5.5 | x |
| *2 | $Sr_{0.5}Ba_{0.5}$ | 0.2 | — | — | — | — | — | CoO | 0.2 | 10 | 8.7 | 1.5 | 0.8 | 2.8 | x |
| 3 | $Sr_{0.5}Ba_{0.5}$ | 0.3 | — | — | — | — | — | CoO | 0.2 | 10 | 18.5 | 0.5 | 1 | −0.18 | ○ |
| 4 | $Sr_{0.5}Ba_{0.5}$ | 0.4 | — | — | — | — | — | CoO | 0.2 | 10 | 20.8 | 0.11 | 0.8 | −0.2 | ○ |
| 5 | $Sr_{0.5}Ba_{0.5}$ | 0.43 | — | — | — | — | — | CoO | 0.2 | 10 | 21.1 | 0.08 | −0.08 | 0.3 | ○ |
| 6 | $Sr_{0.5}Ba_{0.5}$ | 0.45 | — | — | — | — | — | CoO | 0.2 | 10 | 22.3 | 0.07 | −0.05 | 0.24 | ○ |
| 7 | $Sr_{0.5}Ba_{0.5}$ | 0.47 | — | — | — | — | — | CoO | 0.2 | 10 | 20.4 | 0.06 | −0.05 | 0.18 | ○ |
| 8 | $Sr_{0.5}Ba_{0.5}$ | 0.5 | — | — | — | — | — | CoO | 0.2 | 10 | 20.3 | 0.17 | −0.07 | 1.3 | ○ |
| 9 | $Sr_{0.5}Ba_{0.5}$ | 0.7 | — | — | — | — | — | CoO | 0.2 | 10 | 18.9 | 0.32 | −0.11 | 2.8 | ○ |
| 10 | $Sr_{0.5}Ba_{0.5}$ | 0.9 | — | — | — | — | — | CoO | 0.2 | 10 | 17.8 | 0.5 | −0.15 | 3.4 | ○ |
| 11 | $Sr_{0.5}Ba_{0.5}$ | 0.95 | — | — | — | — | — | CoO | 0.2 | 10 | 16.5 | 0.83 | −0.18 | 3.8 | ○ |
| *12 | $Sr_{0.5}Ba_{0.5}$ | 1 | — | — | — | — | — | CoO | 0.2 | 10 | 15.8 | 1.34 | −2.51 | 6.7 | ○ |
| 13 | Sr | 0.45 | — | — | — | — | — | CoO | 0.2 | 10 | 20.6 | 0.85 | −0.11 | 5.3 | ○ |
| 14 | $Sr_{0.8}Ba_{0.2}$ | 0.45 | — | — | — | — | — | CoO | 0.2 | 10 | 20.3 | 0.55 | −0.18 | 4.1 | ○ |
| 15 | $Sr_{0.6}Ba_{0.4}$ | 0.45 | — | — | — | — | — | CoO | 0.2 | 10 | 19.9 | 0.24 | −0.09 | 2.5 | ○ |
| 16 | $Sr_{0.4}Ba_{0.6}$ | 0.45 | — | — | — | — | — | CoO | 0.2 | 10 | 18.6 | 0.11 | −0.06 | 1.3 | ○ |
| 17 | $Sr_{0.2}Ba_{0.8}$ | 0.45 | — | — | — | — | — | CoO | 0.2 | 10 | 16.3 | 0.14 | −0.05 | 1.1 | ○ |
| 18 | Ba | 0.45 | — | — | — | — | — | CoO | 0.2 | 10 | 15.3 | 0.22 | −0.05 | 0.7 | ○ |
| 19 | Ca | 0.45 | — | — | — | — | — | CoO | 0.2 | 10 | 15.1 | 0.42 | −0.13 | 0.8 | ○ |
| *20 | $Sr_{0.5}Ba_{0.5}$ | 0.45 | — | — | — | — | — | — | — | | Unable to measure because of sample breakage | | | | |
| 21 | $Sr_{0.5}Ba_{0.5}$ | 0.45 | — | — | — | — | — | CoO | 0.01 | 10 | 16.8 | 0.74 | −0.7 | 1.3 | ○ |
| 22 | $Sr_{0.5}Ba_{0.5}$ | 0.45 | — | — | — | — | — | CoO | 0.1 | 10 | 18.8 | 0.32 | −0.55 | 1.5 | ○ |
| 23 | $Sr_{0.5}Ba_{0.5}$ | 0.45 | — | — | — | — | — | CoO | 0.3 | 10 | 23.8 | 0.14 | −0.51 | 2.6 | ○ |
| 24 | $Sr_{0.5}Ba_{0.5}$ | 0.45 | — | — | — | — | — | CoO | 0.5 | 10 | 24.5 | 0.33 | −0.37 | 3.7 | ○ |
| 25 | $Sr_{0.5}Ba_{0.5}$ | 0.45 | — | — | — | — | — | CoO | 0.7 | 10 | 25.6 | 0.88 | −0.32 | 4.3 | ○ |
| *26 | $Sr_{0.5}Ba_{0.5}$ | 0.45 | — | — | — | — | — | CoO | 0.8 | 10 | 25.3 | 1.35 | −0.78 | 4.7 | ○ |
| 27 | $Sr_{0.5}Ba_{0.5}$ | 0.45 | — | — | — | — | — | CoO / $MnO_2$ | 0.1 / 0.1 | 10 | 17.7 | 0.88 | −0.12 | 0.84 | ○ |

Asterisk (*) indicates sample out of range of present invention

TABLE 2

| Sample No. | Composition M1 | α | M2 | M3 | β | Ln | γ | Additive Composition | Additive parts by mass | Stable firing temperature range °C | Dynamic piezoelectric constant $d_{33}$ pC/N | Hysteresis % | Rate of change in dynamic piezoelectric constant $d_{33}$ due to temperature 25→−40° C. % | 25→150° C. % | Volume resistivity |
|---|---|---|---|---|---|---|---|---|---|---|---|---|---|---|---|
| *28 | $Sr_{0.5}Ba_{0.5}$ | 0 | Bi | Fe | 0 | — | — | CoO | 0.2 | 30 | 8 | 2 | −2.3 | 5.8 | x |
| *29 | $Sr_{0.5}Ba_{0.5}$ | 0.2 | Bi | Fe | 0 | — | — | CoO | 0.2 | 30 | 13.1 | 1.5 | −1.9 | 4.3 | x |
| 30 | $Sr_{0.5}Ba_{0.5}$ | 0.3 | Bi | Fe | 0 | — | — | CoO | 0.2 | 30 | 19.4 | 0.5 | −1.7 | 4.9 | ○ |
| 31 | $Sr_{0.5}Ba_{0.5}$ | 0.4 | BI | Fe | 0 | — | — | CoO | 0.2 | 30 | 21.8 | 0.2 | −0.1 | 3 | ○ |
| 32 | $Sr_{0.5}Ba_{0.5}$ | 0.4 | Bi | Fe | 0 | — | — | CoO | 0.2 | 30 | 22.2 | 0.01 | −0.08 | 0.48 | ○ |
| 33 | $Sr_{0.5}Ba_{0.5}$ | 0.5 | Bi | Fe | 0 | — | — | CoO | 0.2 | 30 | 22.8 | 0.02 | −0.05 | 0.75 | ○ |
| 34 | $Sr_{0.5}Ba_{0.5}$ | 0.5 | Bi | Fe | 0 | — | — | CoO | 0.2 | 30 | 21.1 | 0.05 | −0.05 | 1.1 | ○ |
| 35 | $Sr_{0.5}Ba_{0.5}$ | 0.5 | Bi | Fe | 0 | — | — | CoO | 0.2 | 30 | 20.7 | 0.11 | −0.07 | 3.6 | ○ |
| 36 | $Sr_{0.5}Ba_{0.5}$ | 0.7 | Bi | Fe | 0 | — | — | CoO | 0.2 | 30 | 20.5 | 0.5 | −0.11 | 4.1 | ○ |
| 37 | $Sr_{0.5}Ba_{0.5}$ | 0.9 | Bi | Fe | 0 | — | — | CoO | 0.2 | 30 | 17.8 | 0.8 | −0.15 | 4.3 | ○ |
| 38 | $Sr_{0.5}Ba_{0.5}$ | 1 | Bi | Fe | 0 | — | — | CoO | 0.2 | 30 | 17.7 | 0.97 | −0.18 | 4.8 | ○ |
| *39 | $Sr_{0.5}Ba_{0.5}$ | 1 | Bi | Fe | 0 | — | — | CoO | 0.2 | 30 | 14.8 | 1.8 | −2.51 | 6.7 | ○ |
| 40 | Sr | 0.5 | Bi | Fe | 0 | — | — | CoO | 0.2 | 30 | 21.8 | 0.85 | −0.11 | 5.1 | ○ |
| 41 | $Sr_{0.8}Ba_{0.2}$ | 0.5 | Bi | Fe | 0 | — | — | CoO | 0.2 | 30 | 21.5 | 0.55 | −0.18 | 3.4 | ○ |
| 42 | $Sr_{0.6}Ba_{0.4}$ | 0.5 | Bi | Fe | 0 | — | — | CoO | 0.2 | 30 | 21.1 | 0.24 | −0.09 | 2.2 | ○ |
| 43 | $Sr_{0.4}Ba_{0.6}$ | 0.5 | Bi | Fe | 0 | — | — | CoO | 0.2 | 30 | 19.8 | 0.21 | −0.06 | 1 | ○ |
| 44 | $Sr_{0.2}Ba_{0.8}$ | 0.5 | Bi | Fe | 0 | — | — | CoO | 0.2 | 30 | 17.5 | 0.2 | −0.05 | 0.8 | ○ |
| 45 | Ba | 0.5 | Bi | Fe | 0 | — | — | CoO | 0.2 | 30 | 15.2 | 0.35 | −0.05 | 0.8 | ○ |
| 46 | Ca | 0.5 | Bi | Fe | 0 | — | — | CoO | 0.2 | 30 | 15.4 | 0.42 | 0.16 | −0.7 | ○ |
| 47 | $Sr_{0.5}Ba_{0.5}$ | 0.5 | Bi | Fe | 0 | — | — | CoO | 0.2 | 10 | 21.1 | 0.11 | −0.05 | 1.8 | ○ |
| 48 | $Sr_{0.5}Ba_{0.5}$ | 0.5 | Bi | Fe | 0 | — | — | CoO | 0.2 | 15 | 21.8 | 0.2 | −0.09 | 1.8 | ○ |
| 49 | $Sr_{0.5}Ba_{0.5}$ | 0.5 | Bi | Fe | 0 | — | — | CoO | 0.2 | 35 | 20.8 | 0.37 | −0.07 | 1.9 | ○ |
| 50 | $Sr_{0.5}Ba_{0.5}$ | 0.5 | Bi | Fe | 1 | — | — | CoO | 0.2 | 40 | 19.5 | 0.77 | −0.08 | 1.3 | ○ |
| *51 | $Sr_{0.5}Ba_{0.5}$ | 0.5 | Bi | Fe | 1 | — | — | CoO | 0.2 | 45 | 18.4 | 1.13 | −0.08 | 1.2 | ○ |
| *52 | $Sr_{0.5}Ba_{0.5}$ | 0.5 | Bi | Fe | 0 | — | — | — | — | 30 | 18.3 | 1.6 | −1.5 | 5.3 | ○ |
| 53 | $Sr_{0.5}Ba_{0.5}$ | 0.5 | Bi | Fe | 0 | — | — | CoO | 0.01 | 30 | 19.4 | 0.73 | −1.4 | 4.2 | ○ |
| 54 | $Sr_{0.5}Ba_{0.5}$ | 0.5 | Bi | Fe | 0 | — | — | CoO | 0.1 | 30 | 20.5 | 0.15 | −1.1 | 2.4 | ○ |
| 55 | $Sr_{0.5}Ba_{0.5}$ | 0.5 | Bi | Fe | 0 | — | — | CoO | 0.3 | 30 | 21 | 0.65 | −1.1 | 1.6 | ○ |
| 56 | $Sr_{0.5}Ba_{0.5}$ | 0.5 | Bi | Fe | 0 | — | — | CoO | 0.5 | 30 | 22.8 | 0.9 | −1.3 | 1.5 | ○ |

TABLE 2-continued

| Sample No. | M1 | α | M2 | M3 | β | Ln | γ | Additive Composition | parts by mass | Stable firing temperature range °C. | Dynamic piezoelectric constant $d_{33}$ pC/N | Hysteresis % | Rate of change in dynamic piezoelectric constant $d_{33}$ due to temperature 25→−40° C. % | 25→150° C. % | Volume resistivity |
|---|---|---|---|---|---|---|---|---|---|---|---|---|---|---|---|
| 57 | $Sr_{0.5}Ba_{0.5}$ | 0.5 | Bi | Fe | 0 | — | — | CoO | 0.7 | 30 | 24.9 | 0.98 | −1.8 | 1.5 | ○ |
| *58 | $Sr_{0.5}Ba_{0.5}$ | 0.5 | Bi | Fe | 0 | — | — | CoO | 0.8 | 30 | 25.7 | 2.15 | −2.1 | 1.46 | ○ |
| 59 | $Sr_{0.5}Ba_{0.5}$ | 0.5 | Bi | Fe | 0 | — | — | CoO<br>$MnO_2$ | 0.1<br>0.1 | 30 | 22.5 | 0.25 | −1.5 | 1.1 | ○ |

Asterisk (*) indicates sample out of range of present invention

TABLE 3

| Sample No. | M1 | α | M2 | M3 | β | Ln | γ | Additive Composition | parts by mass | Stable firing temperature range °C. | Dynamic piezoelectric constant $d_{33}$ pC/N |
|---|---|---|---|---|---|---|---|---|---|---|---|
| *60 | $Sr_{0.5}Ba_{0.5}$ | 0 | — | — | — | La | 0 | CoO | 0.2 | 5 | 3.2 |
| *61 | $Sr_{0.5}Ba_{0.5}$ | 0.2 | — | — | — | La | 0 | CoO | 0.2 | 10 | 6.2 |
| 62 | $Sr_{0.5}Ba_{0.5}$ | 0.3 | — | — | — | La | 0 | CoO | 0.2 | 15 | 18.5 |
| 63 | $Sr_{0.5}Ba_{0.5}$ | 0.4 | — | — | — | La | 0 | CoO | 0.2 | 15 | 21.9 |
| 64 | $Sr_{0.5}Ba_{0.5}$ | 0.4 | — | — | — | La | 0 | CoO | 0.2 | 15 | 22.1 |
| 65 | $Sr_{0.5}Ba_{0.5}$ | 0.5 | — | — | — | La | 0 | CoO | 0.2 | 15 | 23.4 |
| 66 | $Sr_{0.5}Ba_{0.5}$ | 0.5 | — | — | — | La | 0 | CoO | 0.2 | 15 | 21.8 |
| 67 | $Sr_{0.5}Ba_{0.5}$ | 0.5 | — | — | — | La | 0 | CoO | 0.2 | 15 | 20.3 |
| 68 | $Sr_{0.5}Ba_{0.5}$ | 0.7 | — | — | — | La | 0 | CoO | 0.2 | 15 | 20.1 |
| 69 | $Sr_{0.5}Ba_{0.5}$ | 0.9 | — | — | — | La | 0 | CoO | 0.2 | 10 | 18.4 |
| 70 | $Sr_{0.5}Ba_{0.5}$ | 1 | — | — | — | La | 0 | CoO | 0.2 | 15 | 17.7 |
| *71 | $Sr_{0.5}Ba_{0.5}$ | 1 | — | — | — | La | 0 | CoO | 0.2 | 15 | 16.3 |
| 72 | Sr | 0.5 | — | — | — | La | 0 | CoO | 0.2 | 15 | 20.6 |
| 73 | Ba | 0.5 | — | — | — | La | 0 | CoO | 0.2 | 10 | 20.1 |
| 74 | Ca | 0.5 | — | — | — | La | 0 | CoO | 0.2 | 10 | 15.1 |
| 75 | $Sr_{0.45}Ba_{0.45}Ca_{0.1}$ | 0.5 | — | — | — | La | 0 | CoO | 0.2 | 15 | 23.4 |
| 76 | $Ba_{0.95}(Bi_{0.5}Na_{0.5})_{0.05}$ | 0.5 | — | — | — | La | 0 | CoO | 0.2 | 15 | 22.5 |
| 77 | $Sr_{0.5}(Bi_{0.5}Li_{0.5})_{0.5}$ | 0.5 | — | — | — | La | 0 | CoO | 0.2 | 15 | 17.4 |
| 78 | $Sr_{0.5}(Bi_{0.5}K_{0.5})_{0.5}$ | 0.5 | — | — | — | La | 0 | CoO | 0.2 | 10 | 15.8 |
| 79 | $Sr_{0.5}Ba_{0.5}$ | 0.5 | — | — | — | — | — | CoO | 0.2 | 10 | 22.3 |
| 80 | $Sr_{0.5}Ba_{0.5}$ | 0.5 | — | — | — | La | 0 | CoO | 0.2 | 10 | 21.4 |
| 81 | $Sr_{0.5}Ba_{0.5}$ | 0.5 | — | — | — | La | 0 | CoO | 0.2 | 15 | 23.4 |
| 82 | $Sr_{0.5}Ba_{0.5}$ | 0.5 | — | — | — | La | 0 | CoO | 0.2 | 15 | 24.1 |
| 83 | $Sr_{0.5}Ba_{0.5}$ | 0.5 | — | — | — | La | 0 | CoO | 0.2 | 20 | 20.2 |
| 84 | $Sr_{0.5}Ba_{0.5}$ | 0.5 | — | — | — | La | 1 | CoO | 0.2 | 20 | 25.7 |
| *85 | $Sr_{0.5}Ba_{0.5}$ | 0.5 | — | — | — | La | 1 | CoO | 0.2 | 20 | 9.4 |
| 86 | $Sr_{0.5}Ba_{0.5}$ | 0.5 | — | — | — | Nd | 0 | CoO | 0.2 | 10 | 19.9 |
| 87 | $Sr_{0.5}Ba_{0.5}$ | 0.5 | — | — | — | Nd | 0 | CoO | 0.2 | 15 | 17.5 |
| 88 | $Sr_{0.5}Ba_{0.5}$ | 0.5 | — | — | — | Nd | 1 | CoO | 0.2 | 20 | 15.5 |
| *89 | $Sr_{0.5}Ba_{0.5}$ | 0.5 | — | — | — | Nd | 1 | CoO | 0.2 | 20 | 7.3 |
| *90 | $Sr_{0.5}Ba_{0.5}$ | 0.5 | — | — | — | La | 0 | — | — | Unable to measure because of sample breakage | |
| 91 | $Sr_{0.5}Ba_{0.5}$ | 0.5 | — | — | — | La | 0 | CoO | 0.1 | 10 | 18.8 |
| 92 | $Sr_{0.5}Ba_{0.5}$ | 0.5 | — | — | — | La | 0 | CoO | 0.5 | 10 | 24.5 |
| 93 | $Sr_{0.5}Ba_{0.5}$ | 0.5 | — | — | — | La | 0 | CoO | 0.7 | 10 | 24.1 |
| *94 | $Sr_{0.5}Ba_{0.5}$ | 0.5 | — | — | — | La | 0 | CoO | 1 | 15 | 24.3 |
| *95 | $Sr_{0.5}Ba_{0.5}$ | 0.5 | — | — | — | La | 0 | CoO | 1.5 | 20 | 21.4 |

| Sample No. | Hysteresis % | Rate of change in dynamic piezoelectric constant $d_{33}$ due to temperature change 25→−40° C. % | 25→150° C. % | Flexural strength $MP_a$ | Volume resistivity |
|---|---|---|---|---|---|
| *60 | 1.82 | 1.1 | 8.7 | 220 | x |
| *61 | 1.5 | 1.1 | 4.8 | 222 | x |
| 62 | 0.52 | 1 | 0.18 | 238 | ○ |
| 63 | 0.16 | 0.8 | −0.2 | 245 | ○ |
| 64 | 0.13 | −0.08 | 0.3 | 238 | ○ |
| 65 | 0.09 | −0.05 | 0.24 | 240 | ○ |
| 66 | 0.01 | −0.05 | 0.18 | 235 | ○ |
| 67 | 0.13 | −0.08 | 1.02 | 235 | ○ |
| 68 | 0.27 | −0.34 | 1.95 | 220 | ○ |
| 69 | 0.56 | −0.64 | 3.22 | 210 | ○ |
| 70 | 0.86 | −1 | 4.21 | 215 | ○ |

TABLE 3-continued

|   | | | | | |
|---|---|---|---|---|---|
| * | 71 | 1.33 | −2.22 | 7.15 | 213 | ○ |
|   | 72 | 0.89 | −1.01 | 4.32 | 212 | ○ |
|   | 73 | 0.26 | −0.95 | 1.37 | 223 | ○ |
|   | 74 | 0.38 | −0.85 | 1.25 | 210 | ○ |
|   | 75 | 0.54 | −0.58 | 0.74 | 226 | ○ |
|   | 76 | 0.3 | −1.38 | 2.08 | 230 | ○ |
|   | 77 | 0.07 | −1.28 | 3.87 | 240 | ○ |
|   | 78 | 0.09 | −2.01 | 4.44 | 210 | ○ |
|   | 79 | 0.07 | −0.05 | 0.24 | 170 | ○ |
|   | 80 | 0.15 | −0.81 | 1.28 | 235 | ○ |
|   | 81 | 0.18 | −0.41 | 0.76 | 240 | ○ |
|   | 82 | 0.25 | −0.07 | 0.34 | 240 | ○ |
|   | 83 | 0.3 | −0.18 | 0.84 | 240 | ○ |
|   | 84 | 0.65 | −0.05 | 0.88 | 240 | ○ |
| * | 85 | 0.92 | −0.33 | 1.19 | 277 | x |
|   | 86 | 0.33 | −0.08 | 0.3 | 200 | ○ |
|   | 87 | 0.3 | −0.3 | 1.25 | 210 | ○ |
|   | 88 | 0.35 | −1.23 | 2.83 | 275 | ○ |
| * | 89 | 0.31 | −1.3 | 2.97 | 280 | ○ |
| * | 90 | Unable to measure because of sample breakage | | | | |
|   | 91 | 0.69 | −0.55 | 1.5 | 277 | ○ |
|   | 92 | 0.27 | −0.37 | 2.7 | 265 | ○ |
|   | 93 | 0.68 | −0.79 | 2.8 | 256 | ○ |
| * | 94 | 1.28 | −1.33 | 2.87 | 268 | ○ |
| * | 95 | 2.53 | −1.12 | 3.98 | 180 | x |

Asterisk (*) indicates sample out of range of present invention

TABLE 4

| | Sample No. | M1 | α | M2 | M3 | β | Ln | γ | Additive Composition | Additive parts by mass | Stable firing temperature range °C. | Dynamic piezoelectric constant $d_{33}$ pC/N |
|---|---|---|---|---|---|---|---|---|---|---|---|---|
| * | 96 | $Sr_{0.5}Ba_{0.5}$ | 0.2 | Bi | Fe | 0 | La | 0 | CoO | 0.2 | 10 | 6.2 |
|   | 97 | $Sr_{0.5}Ba_{0.5}$ | 0.3 | Bi | Fe | 0 | La | 0 | CoO | 0.2 | 20 | 18.8 |
|   | 98 | $Sr_{0.5}Ba_{0.5}$ | 0.4 | Bi | Fe | 0 | La | 0 | CoO | 0.2 | 20 | 21.1 |
|   | 99 | $Sr_{0.5}Ba_{0.5}$ | 0.43 | Bi | Fe | 0 | La | 0 | CoO | 0.2 | 20 | 23.1 |
|   | 100 | $Sr_{0.5}Ba_{0.5}$ | 0.45 | Bi | Fe | 0 | La | 0 | CoO | 0.2 | 20 | 23.7 |
|   | 101 | $Sr_{0.5}Ba_{0.5}$ | 0.47 | Bi | Fe | 0 | La | 0 | CoO | 0.2 | 20 | 23.8 |
|   | 102 | $Sr_{0.5}Ba_{0.5}$ | 0.6 | Bi | Fe | 0 | La | 0 | CoO | 0.2 | 20 | 22.5 |
|   | 103 | $Sr_{0.5}Ba_{0.5}$ | 0.7 | Bi | Fe | 0 | La | 0 | CoO | 0.2 | 20 | 21.1 |
|   | 104 | $Sr_{0.5}Ba_{0.5}$ | 0.9 | Bi | Fe | 0 | La | 0 | CoO | 0.2 | 20 | 19.8 |
|   | 105 | $Sr_{0.5}Ba_{0.5}$ | 0.95 | Bi | Fe | 0 | La | 0 | CoO | 0.2 | 20 | 18.4 |
| * | 106 | $Sr_{0.5}Ba_{0.5}$ | 1 | Bi | Fe | 0 | La | 0 | CoO | 0.2 | 20 | 17.8 |
|   | 107 | Sr | 0.46 | Bi | Fe | 0 | La | 0 | CoO | 0.2 | 15 | 21.4 |
|   | 108 | Ba | 0.45 | Bi | Fe | 0 | La | 0 | CoO | 0.2 | 15 | 20.1 |
|   | 109 | Ca | 0.45 | Bi | Fe | 0 | La | 0 | CoO | 0.2 | 15 | 16.3 |
|   | 110 | $Sr_{0.45}Ba_{0.45}Ca_{0.1}$ | 0.45 | Bi | Fe | 0 | La | 0 | CoO | 0.2 | 15 | 23.4 |
|   | 111 | $Ba_{0.05}(Bi_{0.5}Na_{0.5})_{0.05}$ | 0.45 | Bi | Fe | 0 | La | 0 | CoO | 0.2 | 20 | 22.5 |
|   | 112 | $Sr_{0.5}(Bi_{0.5}Li_{0.5})_{0.5}$ | 0.45 | Bi | Fe | 0 | L0 | 0 | CoO | 0.2 | 15 | 17.4 |
|   | 113 | $Sr_{0.5}(Bi_{0.5}K_{0.5})_{0.5}$ | 0.45 | Bi | Fe | 0 | La | 0 | CoO | 0.2 | 10 | 15.8 |
|   | 114 | $Sr_{0.5}Ba_{0.5}$ | 0.45 | Bi | Fe | 0 | — | — | CoO | 0.2 | 15 | 22.8 |
|   | 115 | $Sr_{0.5}Ba_{0.5}$ | 0.45 | Bi | Fe | 0 | La | 0 | CoO | 0.2 | 15 | 22.1 |
|   | 116 | $Sr_{0.5}Ba_{0.5}$ | 0.45 | Bi | Fe | 0 | La | 0 | CoO | 0.2 | 20 | 22.8 |
|   | 117 | $Sr_{0.5}Ba_{0.5}$ | 0.45 | Bi | Fe | 0 | La | 0 | CoO | 0.2 | 20 | 22.7 |
|   | 118 | $Sr_{0.5}Ba_{0.5}$ | 0.45 | Bi | Fe | 0 | La | 0 | CoO | 0.2 | 20 | 18.3 |
|   | 119 | $Sr_{0.5}Ba_{0.5}$ | 0.46 | Bi | Fe | 0 | La | 1 | CoO | 0.2 | 20 | 15.9 |
| * | 120 | $Sr_{0.5}Ba_{0.5}$ | 0.45 | Bi | Fe | 0 | La | 1 | CoO | 0.2 | 20 | 9.4 |
|   | 121 | $Sr_{0.5}Ba_{0.5}$ | 0.45 | Bi | Fe | 0 | Nd | 0 | CoO | 0.2 | 10 | 19.9 |
|   | 122 | $Sr_{0.5}Ba_{0.5}$ | 0.45 | Bi | Fe | 0 | Nd | 0 | CoO | 0.2 | 15 | 18.8 |
|   | 123 | $Sr_{0.5}Ba_{0.5}$ | 0.45 | Bi | Fe | 0 | Nd | 1 | CoO | 0.2 | 20 | 16.6 |
| * | 124 | $Sr_{0.5}Ba_{0.5}$ | 0.45 | Bi | Fe | 0 | Nd | 1 | CoO | 0.2 | 25 | 7.3 |
|   | 125 | $Sr_{0.5}Ba_{0.5}$ | 0.45 | Bi | Fe | 0 | La | 0 | CoO | 0.2 | 25 | 21.3 |
|   | 126 | $Sr_{0.5}Ba_{0.5}$ | 0.45 | Bi | Fe | 1 | La | 0 | CoO | 0.2 | 25 | 16.3 |
| * | 127 | $Sr_{0.5}Ba_{0.5}$ | 0.45 | Bi | Fe | 1 | La | 0 | CoO | 0.2 | 25 | 12.3 |
|   | 128 | $Sr_{0.5}Ba_{0.5}$ | 0.45 | Na | Nb | 0 | La | 0 | CoO | 0.2 | 30 | 16.4 |
|   | 129 | $Sr_{0.5}Ba_{0.5}$ | 0.45 | K | Nb | 0 | La | 0 | CoO | 0.2 | 25 | 15.1 |
|   | 130 | $Sr_{0.5}Ba_{0.5}$ | 0.45 | Li | Nb | 0 | La | 0 | CoO | 0.2 | 30 | 15.4 |
| * | 131 | $Sr_{0.5}Ba_{0.5}$ | 0.45 | Bi | Fe | 0 | La | 0 | — | — | 30 | 18.3 |
|   | 132 | $Sr_{0.5}Ba_{0.5}$ | 0.45 | Bi | Fe | 0 | La | 0 | CoO | 0.1 | 20 | 23.9 |
|   | 133 | $Sr_{0.5}Ba_{0.5}$ | 0.45 | Bi | Fe | 0 | La | 0 | CoO | 0.5 | 26 | 21.8 |
|   | 134 | $Sr_{0.5}Ba_{0.5}$ | 0.45 | Bi | Fe | 0 | La | 0 | CoO | 0.7 | 28 | 19.2 |
| * | 135 | $Sr_{0.5}Ba_{0.5}$ | 0.45 | Bi | Fe | 0 | La | 0 | CoO | 1 | 30 | 17.6 |
| * | 136 | $Sr_{0.5}Ba_{0.5}$ | 0.45 | Bi | Fe | 0 | La | 0 | CoO | 1.5 | 30 | 13.7 |

TABLE 4-continued

| | Sample No. | Hysteresis % | Rate of change in dynamic piezoelectric constant $d_{33}$ due to temperature change | | Flexural strength $MP_a$ | Volume resistivity |
|---|---|---|---|---|---|---|
| | | | 25→−40° C. % | 25→150° C. % | | |
| * | 96 | 1.49 | 1.1 | 4.8 | 222 | x |
| | 97 | 0.55 | 1 | −0.18 | 240 | o |
| | 98 | 0.11 | 0.8 | −0.2 | 255 | o |
| | 99 | 0.02 | −0.08 | 0.3 | 255 | o |
| | 100 | 0.1 | −0.06 | 0.24 | 256 | o |
| | 101 | 0.01 | −0.05 | 0.18 | 258 | o |
| | 102 | 0.12 | −0.08 | 1.02 | 265 | o |
| | 103 | 0.36 | −0.34 | 1.95 | 260 | o |
| | 104 | 0.57 | −0.64 | 3.28 | 265 | o |
| | 105 | 0.83 | −1 | 4.89 | 258 | o |
| * | 106 | 1.3 | −2.22 | 7.28 | 255 | o |
| | 107 | 0.84 | −1.01 | 4.12 | 240 | o |
| | 108 | 0.34 | −0.95 | 2.1 | 223 | o |
| | 109 | 0.27 | −0.86 | 3.2 | 210 | o |
| | 110 | 0.37 | −0.58 | 1.8 | 226 | o |
| | 111 | 0.59 | −1.38 | 2.08 | 230 | o |
| | 112 | 0.26 | −1.28 | 3.87 | 240 | o |
| | 113 | 0.07 | −2.01 | 4.44 | 210 | o |
| | 114 | 0.02 | −0.05 | 0.75 | 180 | o |
| | 115 | 0.19 | −0.81 | 1.28 | 250 | o |
| | 116 | 0.21 | −0.41 | 0.76 | 255 | o |
| | 117 | 0.33 | −0.07 | 0.34 | 260 | o |
| | 118 | 0.37 | −0.18 | 0.89 | 280 | o |
| | 119 | 0.69 | −0.05 | 1.78 | 270 | o |
| * | 120 | 0.07 | −0.33 | 2.19 | 277 | x |
| | 121 | 0.35 | −0.08 | 0.3 | 210 | o |
| | 122 | 0.33 | −1.01 | 2.23 | 220 | o |
| | 123 | 0.28 | −1.23 | 2.83 | 276 | o |
| * | 124 | 0.26 | −1.3 | 2.97 | 280 | o |
| | 125 | 0.31 | −0.85 | 1.11 | 256 | o |
| | 126 | 0.35 | −0.75 | 1.3 | 264 | o |
| * | 127 | 0.26 | −0.05 | 2.84 | 288 | o |
| | 128 | 0.25 | −0.88 | 2.87 | 220 | o |
| | 129 | 0.34 | −1.46 | 2.83 | 210 | o |
| | 130 | 0.3 | −1.82 | 3.12 | 230 | o |
| * | 131 | 1.28 | −1.5 | 5.3 | 176 | o |
| | 132 | 0.72 | −0.05 | 3.08 | 212 | o |
| | 133 | 0.3 | −0.05 | 1.35 | 232 | o |
| | 134 | 0.89 | −0.05 | 0.87 | 232 | o |
| * | 135 | 1.37 | −0.05 | 0.21 | 230 | o |
| * | 136 | 2.49 | −0.05 | 0.22 | 230 | x |

Asterisk (*) indicates sample out of range of present invention

As is evident from Tables 1 to 4, in Sample Nos. 3 to 11, 13 to 19, 21 to 25, 27, 30 to 38, 40 to 50, 53 to 57, 59, 62 to 70, 72 to 84, 86 to 88, 91 to 93, 97 to 105, 107 to 119, 121 to 123, 125, 126, 128 to 130, and 132 to 134, the hysteresis is very small at 1% or less, and the dynamic piezoelectric constant $d_{33}$ is 15.1 pC/N or more. These samples are piezoelectric ceramics within the range of the present invention, and in the piezoelectric ceramics, when a bismuth layered compound, as a main component, is represented by the composition formula $Bi_4Ti_3O_{12}\cdot\alpha[(1-\beta)(M1_{1-\gamma}Ln_\gamma)TiO_3+\beta M2M3O_3]$, the relationships $0.3\leq\alpha\leq0.95$, $0\leq\beta\leq0.5$, and $0\leq\gamma\leq0.5$ are satisfied; M1 is at least one selected from Sr, Ba, Ca, $(Bi_{0.55}Na_{0.5})$, $(Bi_{0.5}K_{0.5})$, and $(Bi_{0.5}Li_{0.5})$; M2 is at least one selected from Bi, Na, K, and Li; M3 is at least one selected from Fe and Nb; and Ln represents a lanthanoid, and Co is contained in an amount of 0.01 to 0.7 parts by mass, in terms of CoO, with respect to 100 parts by mass of the main component.

Figure 4:
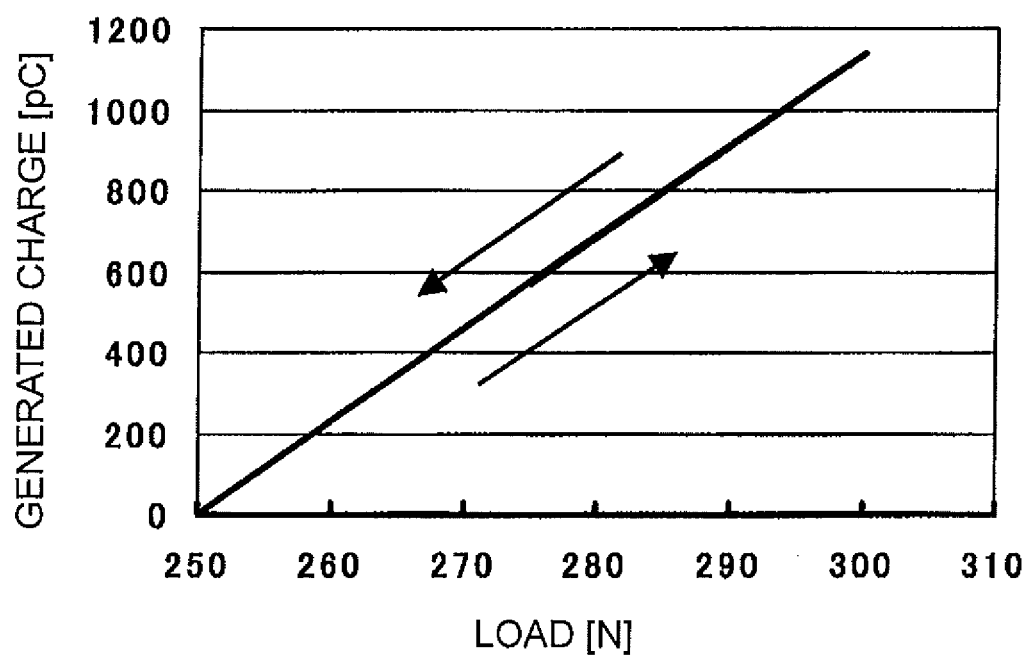
FIG. 4 is a diagram showing the relationship between the load and the generated charge for a piezoelectric ceramic of Sample No. 33.

FIG. 4 shows the measurement results of the load and the generated charge in Sample No. 33. The change in the generated charge with respect to the load is substantially linear, and the hysteresis is very small at 0.02%.

In particular, in Sample Nos. 3 to 11, 14 to 17, 21 to 25, 27, 30 to 38, 41 to 44, 47 to 50, 53 to 57, and 59 in which M1 is $Sr_\delta Ba_{(1-\delta)}$, $0.2\leq\delta\leq0.8$, and $\gamma=0$, the dynamic piezoelectric constant $d_{33}$ is large at 16.3 pC/N or more, and the changes in the dynamic piezoelectric constant $d_{33}$ at −40° C. and 150° C. with respect to the dynamic piezoelectric constant $d_{33}$ at 25° C. can be within ±5%.

In addition, in Sample Nos. 1 to 11, 13 to 19, 21 to 25, 27, and 47 in which $\beta<0.05$, the stable firing temperature range is −5° C. to +5° C., which is in the range of 10° C. In contrast, in Sample Nos. 30 to 38, 40 to 46, 48 to 50, 53 to 57, and 59, since $0.05\leq\beta\leq0.5$, the stable firing temperature range is 15° C. or more even when $\gamma=0$.

In particular, in Sample Nos. 62 to 70, 72 to 78, 80 to 84, 86 to 88, 91 to 93, 97 to 105, 107 to 113, 115 to 119, 121 to 123, 125, 126, 128 to 130, and 132 to 134, the flexural strength is large at 200 MPa or more, and the change in the dynamic piezoelectric constant $d_{33}$ at −40° C. and 150° C. with respect to the dynamic piezoelectric constant $d_{33}$ at 25° C. is within ±5%. These samples contain 0.1 parts by mass or more of Co, in terms of CoO, with respect to 100 parts by mass of the main component of the bismuth layered compound in which, in the composition formula, $0.01\leq\gamma$.

Furthermore, in Sample Nos. 63 to 68, 72, 73, 75, 76, 80 to 84, 92, and 93, the dynamic piezoelectric constant $d_{33}$ is large at 20.1 pC/N or more. These samples contain 0.2 to 1 part by mass of Co, in terms of CoO, with respect to 100 parts by mass of the main component of the bismuth layered compound in which, in the composition formula, $0.4 \leq \alpha \leq 0.7$, $\beta = 0$, the total content of Sr and Ba in M1 is 90 atomic percent or more, and Ln is La.

Furthermore, in Sample Nos. 98 to 103, 108, 110, 111, 115 to 117, 125, 132, and 133, the dynamic piezoelectric constant $d_{33}$ is large at 20.1 pC/N or more. These samples contain 0.1 to 0.5 parts by mass of Co, in terms of CoO, with respect to 100 parts by mass of the main component of the bismuth layered compound in which, in the composition formula, $0.4 \leq \alpha \leq 0.7$, M2M3O$_3$ is BiFeO$_3$, $0.1 \leq \beta \leq 0.3$, the total content of Sr and Ba in M1 is 90 atomic percent or more, and Ln is La.

In addition, in the samples containing 0.1 to 1 part by mass of Co, in terms of CoO, with respect to 100 parts by mass of the bismuth layered compound (main component) in which, in the composition formula represented by $Bi_4Ti_3O_{12}.\alpha[(1-\beta)(M1_{1-\gamma}Ln_\gamma)TiO_3.\beta M2M3O_3]$, the relationships $0.3 \leq \alpha \leq 0.95$, $0 \leq \beta \leq 0.3$, and $0.01 \leq \gamma \leq 0.5$ are satisfied; M1 is at least one selected from Sr, Ba, Ca, (Bi$_{0.5}$Na$_{0.5}$), (Bi$_{0.5}$K$_{0.5}$), and (Bi$_{0.5}$Li$_{0.5}$); M2 is at least one selected from Bi, Na, K, and Li; M3 is at least one selected from Fe and Nb; and Ln represents a lanthanoid, the flexural strength is large at 200 MPa or more, the dynamic piezoelectric constant $d_{33}$ is 15.1 pC/N or more, and the change in the dynamic piezoelectric constant $d_{33}$ at −40° C. and 150° C. with respect to the dynamic piezoelectric constant $d_{33}$ at 25° C. is within ±5%.

Figure 5:
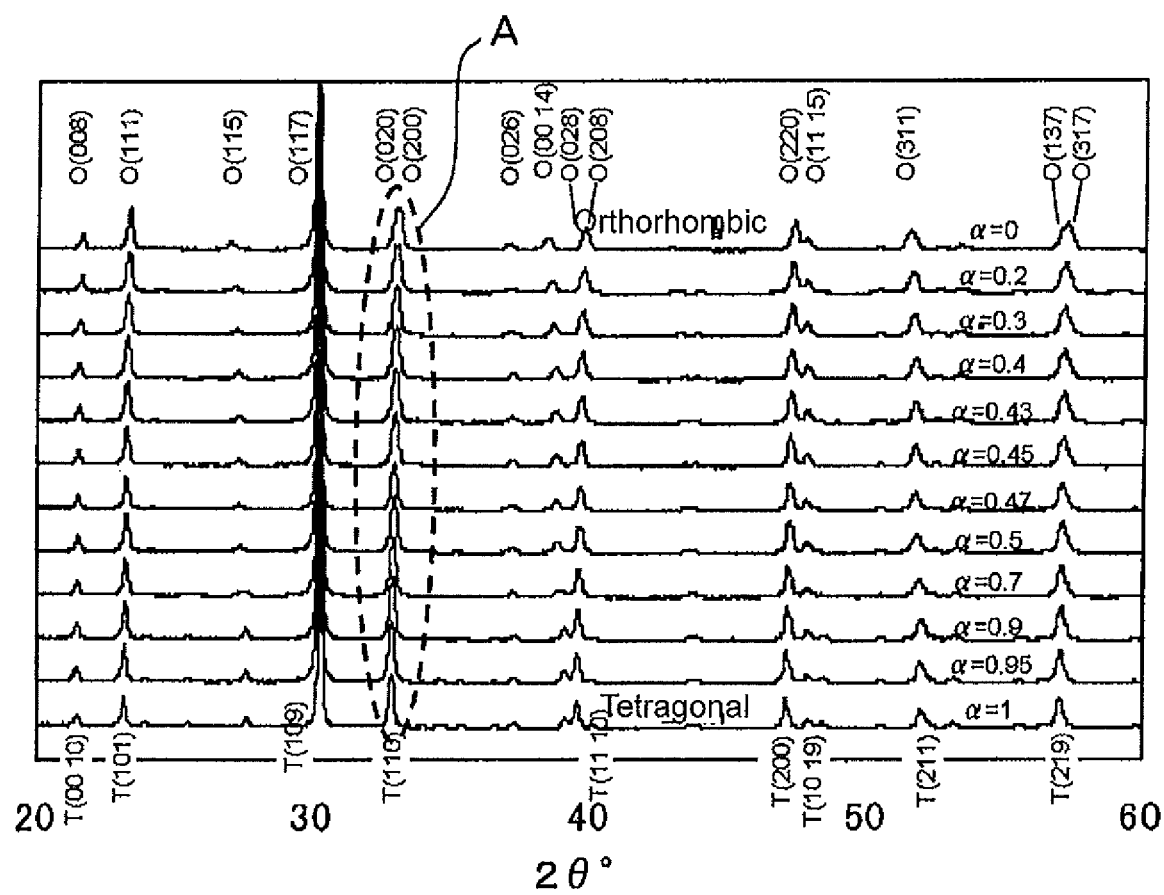
FIG. 5 is an X-ray diffraction chart of piezoelectric ceramics of Sample Nos. 28 to 39.
Figure 6:
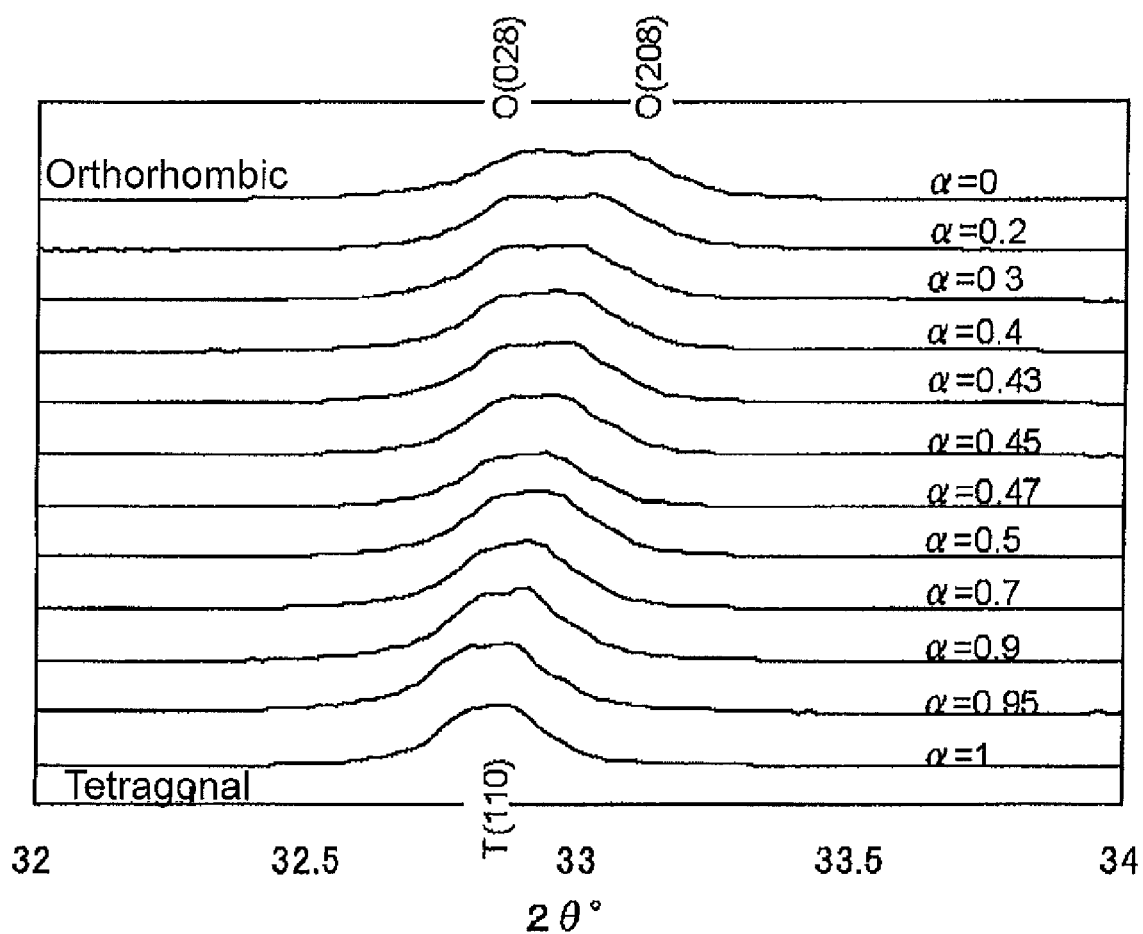
FIG. 6 is an enlarged view of the section A of the X-ray diffraction chart shown in FIG. 5.

FIG. 5 shows the results of X-ray diffraction of Sample Nos. 28 to 39, and FIG. 6 is an enlarged view of a section in which 2θ=32° to 34° in FIG. 5. It is understood that the samples each have a bismuth layered compound as a main crystal phase. If α=0, the crystal is an orthorhombic crystal (length of a axis≠length of b axis), and if α=1, the crystal is a tetragonal crystal (length of a axis=length of b axis). In the range $0.3 \leq \alpha \leq 0.95$, the tetragonal crystal and the orthorhombic crystal coexist, and in particular, in the range $0.4 \leq \alpha \leq 0.45$, a morphotropic phase boundary MPB is observed. The MPB is well known in the field of PZT piezoelectric materials, and the MPB is formed in a compositional region containing the rhombohedral crystal of PZ and the tetragonal crystal of PT at a ratio of about 1:1. The piezoelectric constant d has the maximum value in the vicinity of the MPB of PZT, and the temperature coefficient of the piezoelectric constant d largely varies. As in this phenomenon, since the compositional range $0.4 \leq \alpha \leq 0.45$ corresponds to a boundary between two types of crystal phase, this is the morphotropic phase boundary MPB which exhibits a specific phenomenon of a piezoelectric material, and in which the rate of change in dynamic piezoelectric constant $d_{33}$ due to temperature change decreases to near 0, and a large dynamic piezoelectric constant $d_{33}$ can be obtained.

Figure 8:
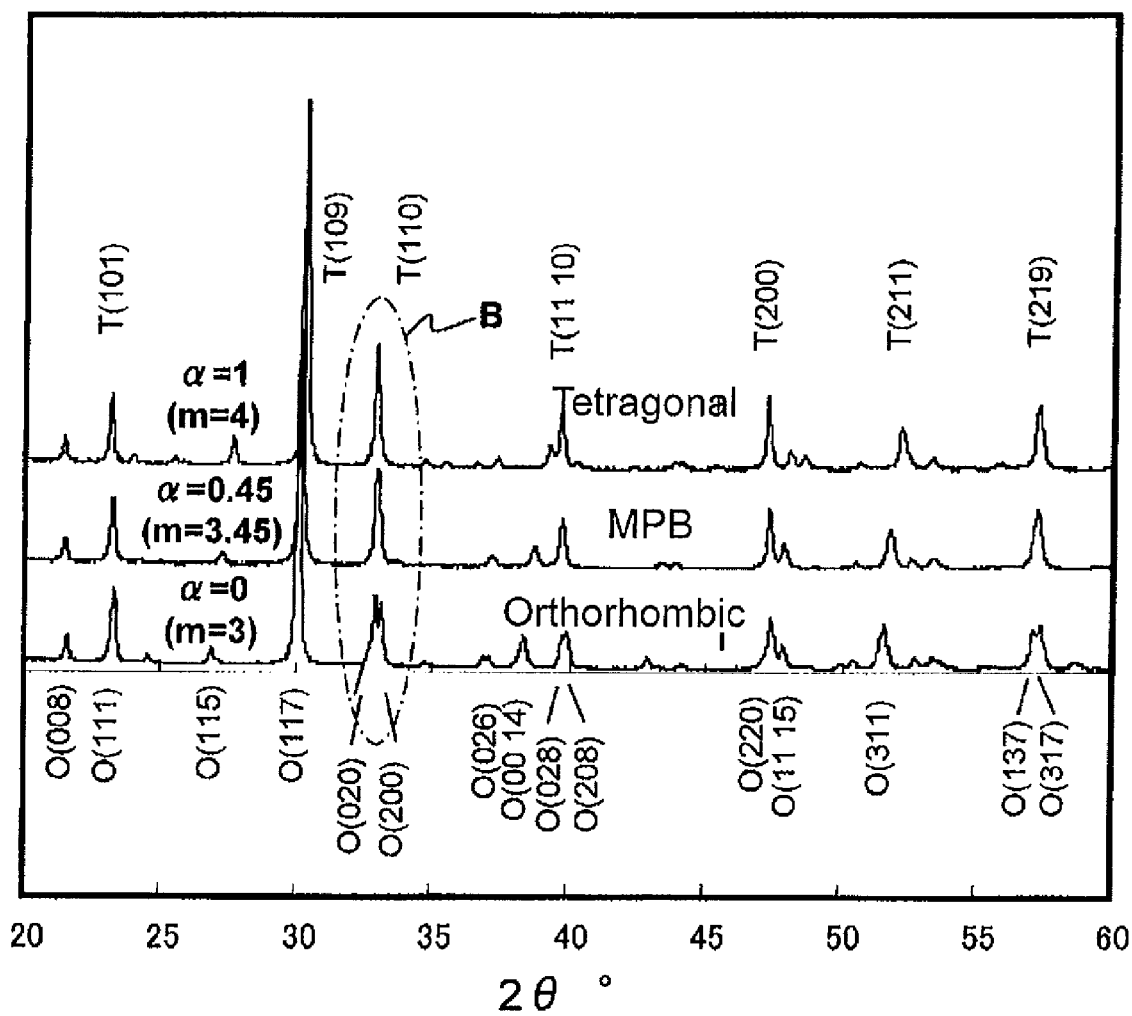
FIG. 8 is an X-ray diffraction chart of piezoelectric ceramics of Sample Nos. 101, 106, and 112.
Figure 9:
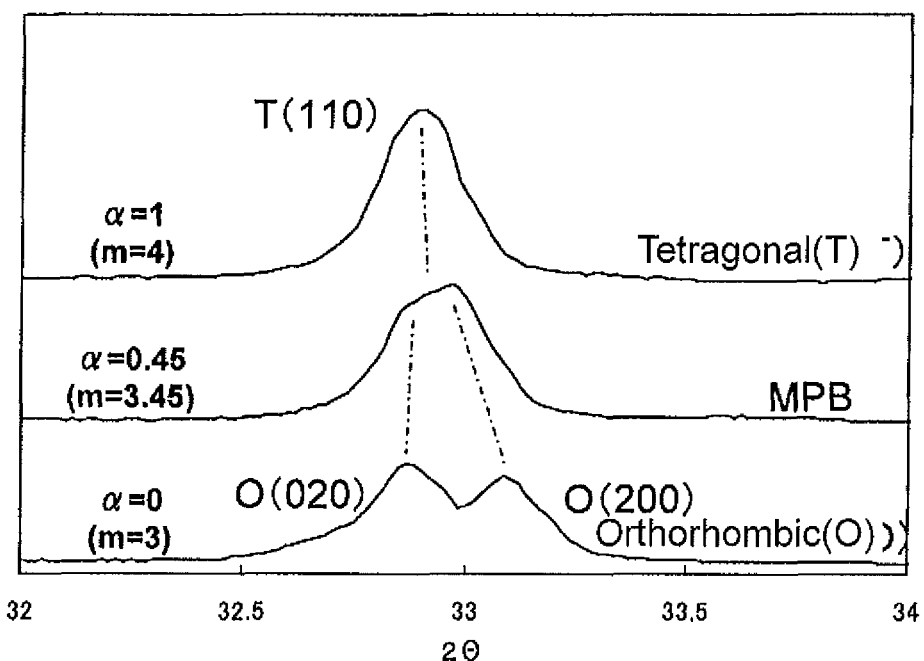
FIG. 9 is an enlarged view of the section B of the X-ray diffraction chart shown in FIG. 8.

FIG. 8 shows the results of X-ray diffraction of Sample Nos. 60, 65, and 71, and FIG. 9 is an enlarged view of a section in which 2θ=32° to 34° in FIG. 8. In the samples in which substitution of a lanthanoid was performed, as in the samples described above, it is understood that the samples each have a bismuth layered compound as a main crystal phase, and the morphotropic phase boundary MPB is observed in the vicinity of α=0.45.

Furthermore, the produced samples were subjected to composition analysis using an X-ray fluorescence analysis apparatus. As a result, the composition of the piezoelectric ceramic of each sample had the same composition ratio as that of the composition of the raw materials prepared. This was confirmed by a method in which the proportions of Bi, Ti, Sr, Ba, Ca, Na, K, Li, Nb, Fe, Co, and Ln (lanthanoid), out of the elements detected, were applied to the composition formula $Bi_4Ti_3O_{12}.\alpha[(1-\beta)(M1_{1-\gamma}Ln_\gamma)TiO_3.\beta M2M3O_3]$ (wherein M1 is at least one selected from Sr, Ba, Ca, (Bi$_{0.5}$Na$_{0.5}$), (Bi$_{0.5}$K$_{0.5}$), and (Bi$_{0.5}$Li$_{0.5}$); M2 is at least one selected from Bi, Na, K, and Li; and M3 is at least one selected from Fe and Nb) to calculate α, β, and γ, and also, on the basis of the ratio between the amount of the components in the composition formula and the amount of CoO, the content (parts by weight) of CoO with respect to 100 parts by weight of the components in the composition formula was calculated.

The invention claimed is:

1. A piezoelectric ceramic comprising:
   a bismuth layered compound represented by a composition formula:

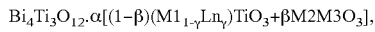
   $Bi_4Ti_3O_{12}.\alpha[(1-\beta)(M1_{1-\gamma}Ln_\gamma)TiO_3+\beta M2M3O_3]$, α, β, and γ satisfy $0.3 \leq \alpha \leq 0.95$, $0 \leq \beta \leq 0.5$, and $0 \leq \gamma \leq 0.5$; M1 is at least one selected from Sr, Ba, Ca, (Bi$_{0.5}$Na$_{0.5}$), (Bi$_{0.5}$K$_{0.5}$), and (Bi$_{0.5}$Li$_{0.5}$); M2 is at least one selected from Bi, Na, K, and Li; M3 is at least one selected from Fe and Nb; and Ln represents a lanthanoid; and
   Co in an amount of 0.01 to 0.7 parts by mass in terms of CoO, with respect to 100 parts by mass of the bismuth layered compound.

2. The piezoelectric ceramic according to claim 1, wherein $0.05 \leq \beta \leq 0.5$.

3. The piezoelectric ceramic according to claim 1, wherein γ=0, M1 is Sr$_\delta$Ba$_{(1-\delta)}$, and $0.2 \leq \delta \leq 0.8$.

4. The piezoelectric ceramic according to claim 1, wherein Co is contained in an amount of 0.1 parts by mass or more, in terms of CoO, with respect to 100 parts by mass of the bismuth layered compound in which $0.01 \leq \gamma$ in the composition formula.

5. The piezoelectric ceramic according to claim 4, wherein Co is contained in an amount of 0.2 parts by mass or more, in terms of CoO, with respect to 100 parts by mass of the bismuth layered compound in which, in the composition formula:

$0.4 \leq \alpha \leq 0.7$ and $\beta = 0$;

the total content of Sr and Ba in M1 is 90 atomic percent or more; and
   Ln is La.

6. The piezoelectric ceramic according to claim 4, wherein Co is contained in an amount of 0.1 to 0.5 parts by mass, in terms of CoO, with respect to 100 parts by mass of the bismuth layered compound in which, in the composition formula:

$0.4 \leq \alpha \leq 0.7$;

M2M3O$_3$ is BiFeO$_3$;

$0.1 \leq \beta \leq 0.3$;

the total content of Sr and Ba in M1 is 90 atomic percent or more; and Ln is La.

7. A piezoelectric element comprising:
   a base member composed of the piezoelectric ceramic according to any one of claims 1 to 6; and
   electrodes on both surfaces of the base member.

* * * * *